(12) United States Patent
Jiang et al.

(10) Patent No.: US 12,074,000 B2
(45) Date of Patent: Aug. 27, 2024

(54) IRON CHROMOPHORES FOR ENERGY CONVERSION

(71) Applicant: Duke University, Durham, NC (US)

(72) Inventors: Ting Jiang, Durham, NC (US); Yusong Bai, Durham, NC (US); George Bullard, Durham, NC (US); Erin J. Viere, Durham, NC (US); Animesh Nayak, Durham, NC (US); Peng Zhang, Durham, NC (US); Courtney Rosenthal, Durham, NC (US); Michael J Therien, Durham, NC (US)

(73) Assignee: DUKE UNIVERSITY, Durham, NC (US)

( * ) Notice: Subject to any disclaimer, the term of this patent is extended or adjusted under 35 U.S.C. 154(b) by 168 days.

(21) Appl. No.: 17/384,603

(22) Filed: Jul. 23, 2021

(65) Prior Publication Data
US 2022/0028624 A1    Jan. 27, 2022

Related U.S. Application Data

(60) Provisional application No. 63/056,470, filed on Jul. 24, 2020.

(51) Int. Cl.
*H01G 9/20* (2006.01)
*C07F 15/02* (2006.01)
*H10K 85/30* (2023.01)

(52) U.S. Cl.
CPC ........... *H01G 9/2059* (2013.01); *C07F 15/02* (2013.01); *H01G 9/2027* (2013.01); *H10K 85/331* (2023.02); *H10K 85/361* (2023.02); *H10K 85/381* (2023.02)

(58) Field of Classification Search
CPC .. H01G 9/2059; H01G 9/2027; H10K 85/331; H10K 85/361; H10K 85/381; C07F 15/02
See application file for complete search history.

(56) References Cited

U.S. PATENT DOCUMENTS 6,350,946 B1 * 2/2002 Miyake ................ H01G 9/2031
136/258

OTHER PUBLICATIONS

Tokyo Chemical Industry reference on N-Heterocyclic Carbene (NHC) Ligands <www.tcichemicals.com/CA/en/c/12645> (Year: 2023).*
Zimmer et al., Towards Noble-Metal-Free Dyads: Ground and Excited State Tuning by a Cobalt Dimethylglyoxime Motif Connected to an Iron N-Heterocyclic Carbene Photosensitizer, Eur. J. Inorg. Chem. 2018, 5203-5214 (Year: 2018).*
Francés-Monerris et al Photophysical properties of bichromophoric Fe(II) complexes bearing an aromatic electron acceptor, Theor Chem Acc 138, 86 (2019) (Year: 2019).*

(Continued)

*Primary Examiner* — Andrew J Golden
(74) *Attorney, Agent, or Firm* — Talem IP Law, LLP

(57) ABSTRACT

Iron-based photosensitizers, which can be used for solar energy conversion and photoluminescence applications, include an iron complex with N-heterocyclic carbene (NHC) ligands (FeNHC), a linking unit, and a polarizable unit formed of a pi conjugated structure having a one-electron reduction potential more positive than NHC.

18 Claims, 21 Drawing Sheets

(56) References Cited

OTHER PUBLICATIONS

Masaaki Saitow et al. "Accurate spin-densities based on the domain-based local pair-natural orbital coupled-cluster theory", The Journal of Chemical Physics, Jul. 19, 2018, 16 pages, vol. 149, AIP Publishing.

Wojciech Gawelda et al. "Ultrafast Nonadiabatic Dynamics of [FeII(bpy)3]2+ in Solution", JACS Articles, Jun. 9, 2007, 8 pages, vol. 129, No. 26, American Chemical Society.

Jozef Šima, "(Non)luminescent properties of iron compounds", Acta Chimica Slovaca, 2015, 7 pages, vol. 8, No. 2.

M. K. Nazeeruddin et al. "Conversion of Light to Electric by Cis-X2Bis(2,2'-bipyridyl-4,4'-dicarboxylate) ruthenium (II) Charge-Transfer Sensitizers (X=Cl⁻, Br⁻, I⁻, CN⁻, and SCN⁻) on Nanocrystalline TiO2 Electrodes", 1993, 9 pages, vol. 115, No. 14, American Chemical Society.

Thibaut Duchanois et al. "An Iron-Based Photosensitizer with Extended Excited-State Lifetime: Photophysical and Photovoltaic Properties", EurJIC (European Journal of Inorganic Chemistry), Apr. 14, 2015, 9 pages, Wiley-VCH Verlag Gmbh & Co. KGaA, Wiley Online Library.

Yang Guo, et al. "Communication: An improved linear scaling perturbative triples correction for the domain based local pair-natural orbital based singles and doubles coupled cluster method [DLPNO-CCSD(T)]", The Journal of Chemical Physics, Jan. 4, 2018, 6 pages, vol. 148, AIP Publishing.

Linnea Lindh et al. "Photophysics and Photochemistry of Iron Carbene Complexes for Solar Energy Conversion and Photocatalysis", Catalysts, Mar. 10, 2020, 30 pages.

Benjamin Schulze et al. "A Heteroleptic Bis(tridentate) Ruthenium (II) Complex of a Click-Derived Abnormal Carbene Pincer Ligand with Potential for Photosensitzer Application", Chemistry A European Journal, Apr. 12, 2011, 5 pages, vol. 17, Wiley-VCH Verlag Gmbh & Co. KGaQ, Weinheim.

Edwin C. Constable et al. "2,2':6',4"-Terpyridine: a cyclometallating analogue of 2,2':6',2"-terpyridine for metallosupramolecular chemistry", Inorganica Chimica Acta 235, 1995, 7 pages, Elsevier Science S.A.

Douglas G. Brown et al. "Bis(tridentate) Ruthenium-Terpyridine Complexes Featuring Microsecond Excited-State Lifetimes", JACS (Journal of the American Chemical Society), Jul. 18, 2012, 4 pages, ACS Publications.

Lifen Chen et al. "Co-reactant Electrogenerated Chemiluminescence of Iridium (III) Complexes Containing an Acetylacetonate Ligand", ChemElectroChem Articles, May 3, 2017, 12 pages, Wiley-VCH Verlag Gmbh & Co. KGaA, Weinheim.

Kenneth J. H. Young et al. "Cyclometalation of 6-Phenyl-2,2'-Bipyridine and Iridium: Synthesis, Characterization, and Reactivity Studies", Organometallics, May 14, 2009, 12 pages, vol. 28, No. 12, American Chemical Society.

Joydev Dinda et al. "Electronic and geometrical manipulation of the excited state of bis-terdentate homo- and heteroleptic ruthenium complexes", Dalton Transactions, Jan. 20, 2011, 6 pages, vol. 40, The Royal Society of Chemistry.

Matthias Bauer et al. "Janus-type dual emission of a Cyclometalated Iron (III) complex", Research Square, 2020, 19 pages.

Renso Visbal et al. "N-heterocyclic carbene metal complexes: photoluminescence and applications", Chem. Soc. Rev., 2014, 24 pages, vol. 43, The Royal Society of Chemistry.

Brian O'Regan et al. "A low-cost, high-efficiency solar cell based on dye-sensitizied colloidal TiO2 films", Letters to Nature, Oct. 24, 1991, 4 pages, vol. 353, Nature Publishing Group.

Anders Hagfeldt et al. "Dye-Sensitized Solar Cells", Chemical Reviews, Oct. 8, 2010, 69 pages, vol. 110, No. 11, American Chemical Society.

W. Justin Youngblood et al. "Photoassisted Overall Water Splitting in a Visible Light-Absorbing Dye-Sensitizied Photoelectrochemical Cell", JACS Communication, 2009, 2 pages, vol. 131, American Chemical Society.

Dennis L. Ashford et al. "Molecular Chromophore-Catalyst Assemblies for Solar Fuel Applications", Chemical Reviews, Oct. 29, 2015, 44 pages, vol. 115, ACS Publications.

Christopher K. Prier et al. "Visible Light Photoredox Catalysis with Transition Metal Complexes: Applications in Organic Synthesis", Chemical Reviews, Mar. 19, 2013, 42 pages, vol. 113, ACS Publications.

Danielle M. Schultz et al. "Solar Synthesis: Prospects in Visible Light Photocatalysis", Science, Feb. 28, 2014, 10 pages, vol. 343, Issue 6174, American Association for the Advancement of Science.

Matthew J. Jurow et al. "Understanding and predicting the orientation of heteroleptic phosphors in organic light-emitting materials", Nature Materials, Oct. 5, 2015, 9 pages, vol. 15, Macmillan Publishers Limited.

Jaesang Lee et al. "Deep blue phosphorescent organic light-emitting diodes with very high brightness and efficiency", Nature Materials, Oct. 19, 2015, 8 pages, vol. 15, Macmillan Publishers Limited.

Lucia Flamigni et al. "Iridium Terpyridine Complexes as Functional Assembling Units in Arrays for the Conversion of Light Energy", Accounts of Chemical Research, Jul. 2008, 15 pages, vol. 41, No. 7, American Chemical Society. www.pubs.acs.org/acr.

Georgios C. Vougioukalakis et al., "Contributions to the development of ruthenium-based sensitizers for dye-sensitized solar cells", Coordination Chemistry Reviews, Nov. 12, 2010, 20 pages, Elsevier B. V.

Hui Xu et al. "Recent Progress in Metal-Organic Complexes for Optoelectronic Applications", Chemical Society Reviews, Feb. 17, 2014, 45 pages, vol. 43, Royal Society of Chemistry.

Jeremy E. Monat et al. "Femtosecond Excited-State Dynamics of an Iron(II) Polypyridyl Solar Cell Sensitizer Model", Journal of the American Chemical Society, Jan. 18, 2000, 6 pages, vol. 122, No. 17.

Lindsey L. Jamula et al. Synthesis and Characterization of a High-Symmetry Ferrous Polypyridyl Complex: Approaching the 5T2/3T1 Crossing Point for FeII, Inorganic Chemistry, Dec. 17, 2013, 3 pages, vol. 53, ACS Publications (American Chemical Society).

Andreas K.C. Mengel et al. "A Heteroleptic Push-Pull Substituted Iron(II) Bis(tridentate) Complex with Low-Energy Charge-Transfer States", Chemistry A European Journal, 2015, 11 pages, vol. 21, Wiley Online Library, Wiley-VCH Verlag Gmbh & Co. KGaA, Weinheim.

Pavel Chábera et al. "A low-spin Fe(III) complex with 100-ps ligand-to-metal charge transfer photoluminescence", Nature, Mar. 30, 2017, 19 pages, vol. 543, Macmillan Publishers Limited.

Kasper Skov Kjaer et al. "Luminescence and reactivity of a charge-transfer excited iron complex with nanosecond lifetime", Science, Research I Report Inorganic Chemistry, Jan. 18, 2019, 6 pages, vol. 363.

Yizhu Liu et al. "Towards longer-lived metal-to-ligand charge transfer states of iron(II) complexes: an N-heterocyclic carbene approach", Chem Comm Communication, 2013, 3 pages, vol. 49, RSC Publishing.

Yizhu Liu et al. "A Heteroleptic Ferrous Complex with Mesoionic Bis(1,2,3-triazol-5-ylidene) Ligands: Taming the MLCT Excited State of Iron(II)", Chemistry A European Journal, 2015, 12 pages, vol. 21, Wiley-VCH Verlag GmbH & Co. KGaA, Weinheim.

Li Liu et al. "A new record excited state 3MLCT lifetime for metalorganic iron(II) complexes", Phys. Chem. Chem. Phys., 2016, 7 pages, vol. 18, Royal Society of Chemistry.

Yizhu Liu et al. "Fe N-Heterocyclic Carbene Complexes as Promising Photosensitizers", Accounts of Chemical Research, Jul. 25, 2016, 9 pages, vol. 49, ACS Publications, pubs.acs.org/accounts.

Pavel Chábera et al. FeII Hexa N-Heterocyclic Carbene Complex with a 528 ps Metal-to-Ligand Charge-Transfer Excited-State Lifetime, The Journal of Physical Chemistry Letters, Jan. 3, 2018, 5 pages, vol. 9, ACS Publications.

Maria Abrahamsson et al. "Bistridentate Ruthenium(II)polypyridyl-Type Complexes with Microsecond 3MLCT State Lifetimes: Sensitizers for Rod-Like Molecular Arrays", JACS Articles, Oct. 29, 2008, 10 pages, American Chemical Society, vol. 130, No. 46.

(56) References Cited

OTHER PUBLICATIONS

Amlan K. Pal et al. "Design, synthesis and excited-state properties of mononuclear Ru(II) complexes of tridentate heterocyclic ligands", Chem. Soc. Review, 2014, 14 pages, vol. 43, The Royal Society of Chemistry.

Peter Zimmer et al. The Connection between NHC Ligand Count and Photophysical Properties in Fe(Il) Photosensitizers: An Experimental Study, Inorganic Chemistry, 2018, 14 pages, vol. 57, ACS Publications.

H. Tetsuo Uyeda et al. "Unusual Frequency Dispersion Effects of the Nonlinear Optical Response in Highly Conjugated (Polypyridyl)metal-(Porphinato)zinc(II) Chromophores", JACS Articles, Oct. 25, 2002, 8 pages, vol. 124, Journal of the American Chemical Society.

Timothy V. Duncan et al. "Highly Conjugated (Polypyridyl)metal-(Porphinato)zinc(II) Compounds: Long-Lived, High Oscillator Strength, Excited-State Absorbers Having Exceptional Spectral Coverage of the Near-Infrared", JACS Communications, Jul. 14, 2004, 2 pages, vol. 126, No. 31, Journal of the American Chemical Society.

Timothy V. Duncan et al. "Molecular Engineering of Intensely Near-Infrared Absorbing Excited States in Highly Conjugated Oligo(porphinato)zinc-(Polypyridyl)metal(II) Supermolecules", JACS Articles, Jul. 13, 2007, 13 pages, vol. 129, No. 31, Journal of the American Chemical Society.

Tanya N. Singh-Rachford et al. "Supermolecular-Chromophore-Sensitized Near-Infrared-to-Visible Photon Upconversion", JACS Articles, Sep. 9, 2010, 9 pages, vol. 132, No. 40, Journal of the American Chemical Society.

Tomoya Ishizuka et al. "The Role of Molecular Structure and Effective Optical Symmetry in Evolving Dipolar Chromophoric Building Blocks to Potent Octopolar Nonlinear Optical Chromophores", JACS Articles, Feb. 15, 2011, 13 pages, vol. 133, ACS Publications.

H. Christopher Fry et al. "Computational de Novo Design and Characterization of a Protein That Selectively Binds a Highly Hyperpolarizable Abiological Chromophore", Journal of the American Chemical Society (JACS), Aug. 9, 2013, 13 pages, vol. 135, ACS Publications.

Jean-Hubert Olivier et al. "Near-Infrared-to-Visible Photon Upconversion Enabled by Conjugated Porphyrinic Sensitizers under Low-Power Noncoherent Illumination", The Journal of Physical Chemistry, May 11, 2015, 8 pages, vol. 119, ACS Publications, The American Chemical Society.

Animesh Nayak et al. "Large Hyperpolarizabilities at Telecommunication-Relevant Wavelengths in Donor-Acceptor-Donor Nonlinear Optical Chromophores", ACS Central Science, American Chemical Society, Dec. 16, 2016, 13 pages, vol. 2, ACS Publications.

Ting Jiang et al. "Engineering High-Potential Photo-oxidants with Panchromatic Absorption", Journal of the American Chemical Society (JACS), Jun. 14, 2017, 4 pages, vol. 139, ACS Publications.

Yusong Bai et al. "Molecular Road Map to Tuning Ground State Absorption and Excited State Dynamics of Long-Wavelength Absorbers", JACS (Journal of the American Chemical Society), Oct. 18, 2017, 13 pages, vol. 139, ACS Publications.

Nicholas F. Polizzi et al. "Engineering opposite electronic polarization of singlet and triplet states increases the yield of high-energy photoproducts", Proceedings of the National Academy of Science of the United States of America (PNAS), Jul. 16, 2019, 6 pages, vol. 116, No. 29.

Bing Shan et al. Excitation energy-dependent photocurrent switching in a single-molecule photodiode, Proceedings of the National Academy of Science of the United States of America (PNAS), Aug. 13, 2019, 6 pages, vol. 116, No. 33.

Shahar Keinan et al. "Molecular Design of Porphyrin-Based Nonlinear Optical Materials", J. Phys. Chem A, Oct. 31, 2008, 5 pages, vol. 112, No. 47, American Chemical Society.

Xiangqian Hu et al. "Predicting the Frequency Dispersion of Electronic Hyperpolarizabilities on the Basis of Absorption Data and Thomas-Kuhn Sum Rules", J. Phys. Chem. C, Jan. 15, 2010, 11 pages, vol. 114, American Chemical Society.

Amanda L. Smeigh et al. "Femtosecond Time-Resolved Optical and Raman Spectroscopy of Photoinduced Spin Crossover: Temporal Resolution of Low-to-High Spin Optical Switching", JACS Communications, Oct. 1, 2008, 3 pages, vol. 130, American Chemical Society.

Gerald Auböck et al. "Sub-50-fs photoinduced spin crossover in [Fe(bpy)3]2+", Nature Chemistry, Jul. 20, 2015, 5 pages, vol. 7, Macmillan Publishers Limited.

\* cited by examiner

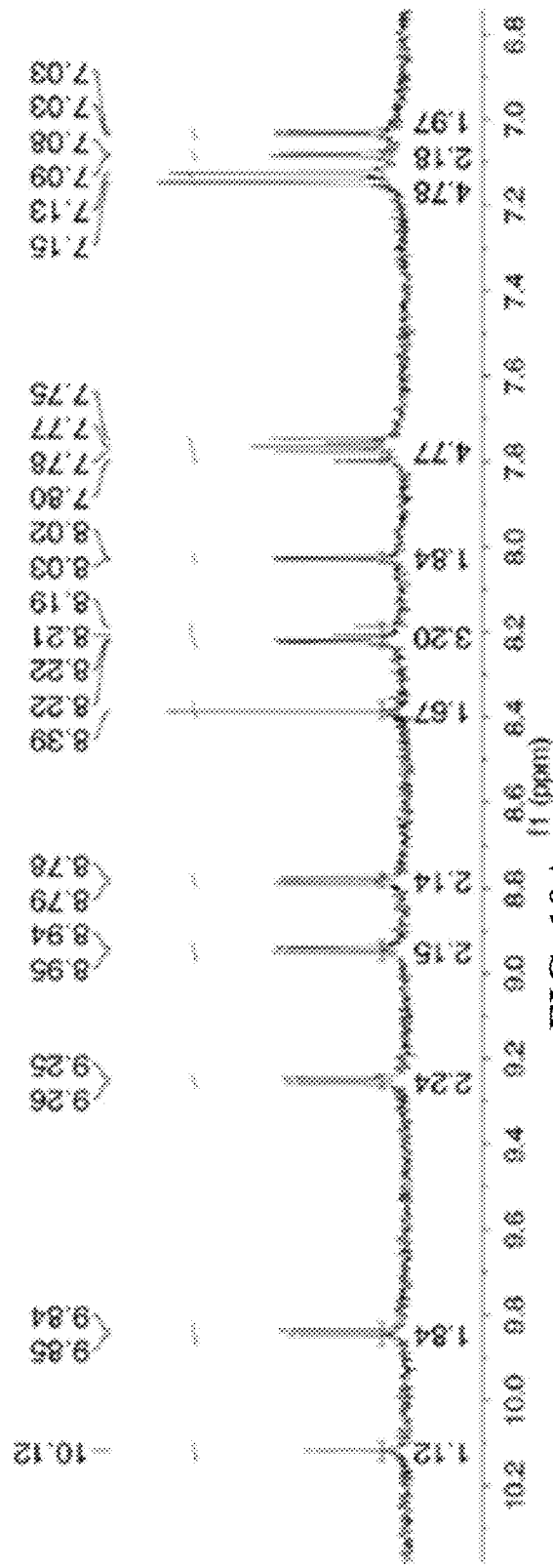
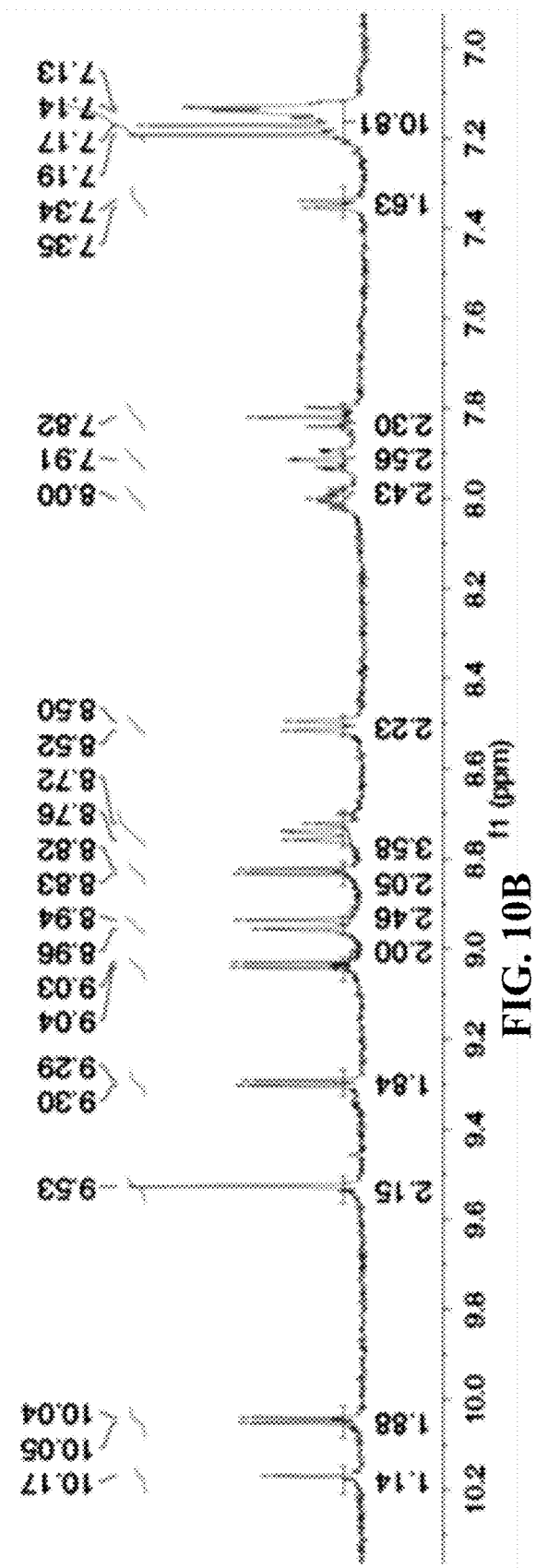
FIG. 10A
FIG. 10B

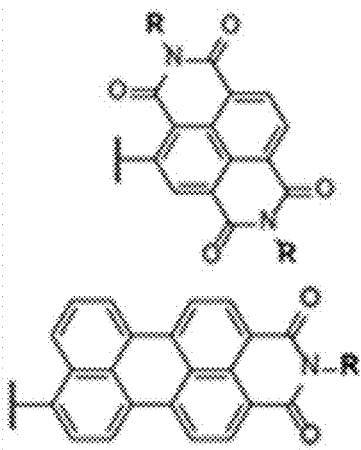
FIG. 20A
FIG. 20B
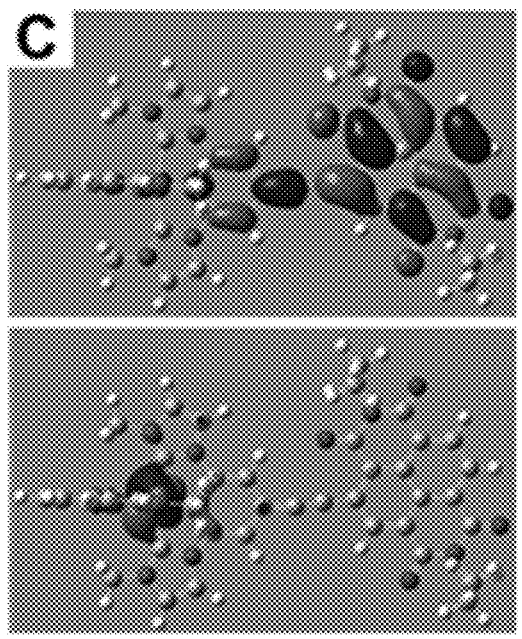
FIG. 20C
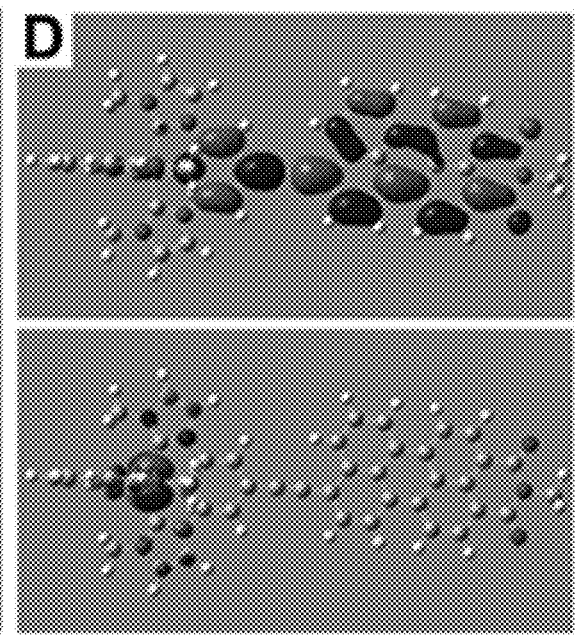
FIG. 20D
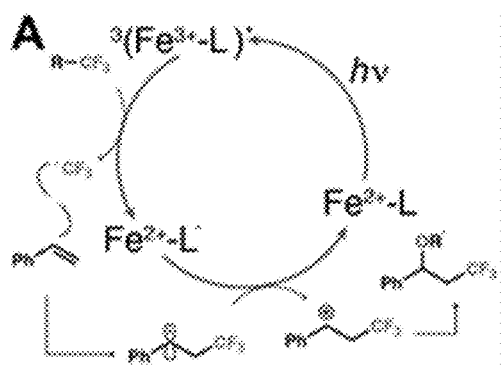
FIG. 21A
FIG. 21B

IRON CHROMOPHORES FOR ENERGY CONVERSION

CROSS-REFERENCE TO RELATED APPLICATIONS

The present invention claims the benefit of U.S. Provisional Application Ser. No. 63/056,470, filed Jul. 24, 2020, which is hereby incorporated by reference in its entirety, including any figures, tables, and drawings.

BACKGROUND

Solar energy conversion applications include dye-sensitized solar cells (DSSCs), photoelectrochemical cells, photoredox catalysis, and light-emitting diode technologies.

DSSCs are a photovoltaic, solar technology that can be manufactured using roll-to-roll printing on transparent and flexible materials, supporting photovoltaic building facades, solar-harvesting canopies (e.g., car ports, shades), and solar-powered consumer goods and electronics.

Photoelectrochemical cells use the photovoltaic effect to produce electrical energy or, when immersed in an electrolytic solution, to directly cause a chemical reaction.

Photoredox catalysis uses photoredox catalysts to provide or take a single-electron when excited by light, enabling light to power a reaction and the ability to generate energy rich molecules.

Light emitting diode technologies can be used to harvest solar energy since LEDs, particularly semiconductor material-based LEDs, can behave as inefficient solar cells.

These solar energy conversion applications provide numerous benefits and applications due to harnessing a renewable energy source. However, rare, expensive, and toxic heavy metal complexes (e.g., Ru(II), Os(II), Ir(III)) dominate dye-sensitized solar cell, photoelectrochemical cell, photo-redox catalysis, and light-emitting diode applications.

Iron's abundance and favorability from an industrial, sustainability, and environmentally friendly perspective makes it one of the most appealing transition metal elements for developing large-scale molecular-based technologies. However, iron is among the scientifically most challenging elements to use for photochemical applications since iron complexes typically undergo ultrafast deactivation to high-spin metal centered (MC) (or ligand field (LF)) states Therefore, it has been a long-standing goal to develop iron complexes that manifest long-lived metal-to-ligand charge-transfer (MLCT) excited-state lifetimes. Such complexes, if realized, would provide the opportunity to replace the analogous rare, expensive, and toxic heavy metal complexes with those based on earth-abundant iron. As mentioned above, a critical scientific hurdle has been that conventional Fe complexes suffer from femtosecond timescale quenching of their respective photo-reactive MLCT states by low-lying nonreactive metal center (MC) states. Indeed, a main hurdle that prevents earth-abundant iron-based complexes from replacing the environmentally unfriendly and expensive heavy metal complexes in solar energy conversion applications is this typical ultra-short (femtosecond timescale) charge-transfer state lifetime of Fe(II) chromophores.

In detail, transition-metal-based photosensitizers are extensively exploited for solar energy conversion applications that include dye-sensitized solar cells (DSSCs), photoelectrochemical cells, and photo-redox catalysis, as well as in light-emitting diode technologies. The long-lived metal-to-ligand charge-transfer (MLCT) states and moderate light absorptivity of ruthenium and iridium complexes make them the most widely utilized photosensitizers for these applications; however, their large-scale technological implementation is severely impeded by the rarity and toxicity of these metals. Replacing these metals with iron, the earth-abundant lighter congener of ruthenium, offers an attractive solution. Yet any energy conversion reaction that might be driven by iron complexes is challenging, as they typically suffer from femtosecond timescale quenching of their respective photo-reactive charge-transfer (CT) states by low-lying nonreactive metal-centered (MC) states. After decades of exploration, while novel Fe(III) complexes exhibiting up to nanosecond timescale $^2$LMCT (ligand-to-metal charge-transfer) lifetimes and $^2$LMCT→$^2$GS (ground state) fluorescence have been developed, advancement of Fe(II) complexes that mimic the benchmark $^3$MLCT state photophysics of their Ru(II)/Os(II) analogues, has long been overdue.

BRIEF SUMMARY

Iron-based photosensitizers are described, which can be used for solar energy conversion and photoluminescence applications.

An iron-based photosensitizer suitable for solar energy conversion applications includes an iron complex with N-heterocyclic carbene (NHC) ligands (FeNHC), a linking unit, and a polarizable unit formed of a pi conjugated structure having a one-electron reduction potential more positive than NHC.

Accordingly, presented herein is a design for efficient iron-based photosensitizers, including an Fe(II) complex archetype, FeNHCPZn, which features a profoundly extended metal-to-ligand charge-transfer ($^3$MLCT) lifetime and a large transition-dipole moment difference between its ground and metal-to-ligand charge-transfer states. This supermolecular design promotes superior visible photon absorptivity over classic metal complexes while assuring a triplet excited-state oxidation potential appropriate for a myriad of synthetic transformations including charge injection into the conduction bands of common semiconductor electrode materials, highlighting its photosensitizing utility in dye-sensitized solar-cell architectures.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIGS. 10A and 10B show $^1$H NMR spectrum plots of FeNHCPZn and FeTpyPZn, respectively.

FIGS. 20A-20D summarize benchmark calculations for candidate FeNHC-acceptor systems. FIG. 20A shows relative potential energies, in eV (top), and dipole moments, in D (bottom), of the lowest energy singlet, triplet, and quintet states of FeNHC-NDI and FeNHC-PMI; the X-axis aligns with the ethyne bridge in each structure; FIG. 20B shows molecular structures of the NDI (top) and PMI (bottom) acceptor moieties; and FIGS. 20C and 20D show singly occupied molecular orbitals (SOMOs) for the T$_1$ state of FeNHC-NDI and FeNHC-PMI, respectively.

FIG. 21A illustrates a photoredox catalyst synthetic scheme incorporating a photoredox catalyst as described with respect to FIG. 4B.

FIG. 21B shows triplet-triplet energy transfer from iron-based triplet sensitizer to acceptor molecules.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Iron-based photosensitizers are described, which can be used for solar energy conversion and photoluminescence applications.

Figure 1A:
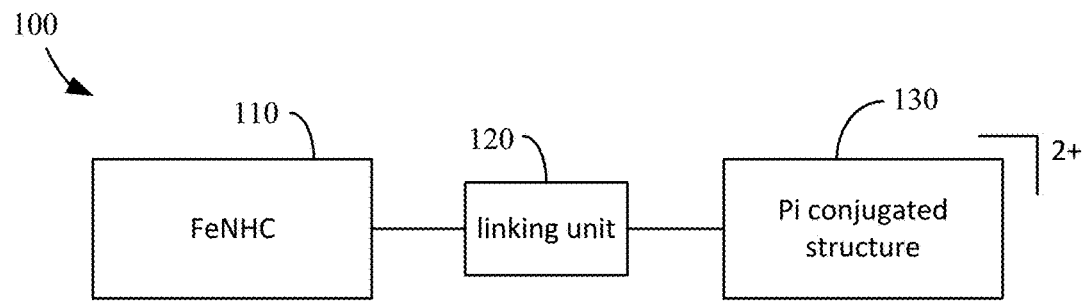
FIG. 1A illustrates an iron-based photosensitizer compound.

FIG. 1A illustrates an iron-based photosensitizer compound. Referring to FIG. 1, a photosensitizer compound 100 includes an iron complex with N-heterocyclic carbene (NHC) ligands (FeNHC) 110, a linking unit 120, and a polarizable unit 130. The polarizable unit 130 is formed of a pi conjugated structure having a one-electron reduction potential more positive than NHC.

The FeNHC 110 can be an Fe(II)N-heterocyclic carbene complex or an Fe(III)N-heterocyclic carbene complex. The N-heterocyclic carbene (NHC) ligand of the FeNHC 110 can include, but is not limited to, 2,6-bis(N-methylimidazol-2-ylidene)pyridine, 2',6'-bis(1-mesityl-3-methyl-1,2,3-triazol-4-yl-5-idene)pyridine (CNC), 1,1'-(1,3-phenylene)bis(3-methyl-1-imidazol-2-ylidene (HImP), 6-phenyl-2,2'-bipyridine (Hpbpy), 2,2': 6',4"-Terpyridine (HL), 1,1'-((1H-pyrrole-2,5-diyl)bis(methylene))bis(3-methyl-1H-imidazol-3-ium), N-methyl-N'-(2-pyridyl)-imidazol-2-ylidene, 3,3'-dimethyl-1,1'-bis(p-tolyl)-4,4'-bis(1,2,3-triazol-5-ylidene) (btz) and 2-phenylpyridine, and their derivatives. Thirty examples of Fe(II)NHC complexes can be found in "Photophysics and Photochemistry of Iron Carbene complexes for Solar Energy Conversion and Photocatalysis," (Lindh et al. Catalysts 2020, 10, 315).

The linking unit 120 is ethynyl, vinyl, thiophenyl, diethynylaryl, divinylaryl, diethynyl(unsaturated heterocycloalkenyl), divinyl(unsaturated heterocycloalkenyl), diethynyl (unsaturated heterocycloalkynyl), or divynyl(unsaturated heterocycloalkynyl).

The polarizable unit 130 is any suitable pi conjugated structure having one-electron reduction potential more positive than NHC. In some cases, the polarizable unit 130 includes porphyrin, porphycene, rubyrin, rosarin, hexaphyrin, sapphyrin, chlorophyl, chlorin, phthalocyanine, porphyrazine, bacteriochlorophyl, pheophytin, texaphyrin, or a related macrocyclic-based component that is capable of binding a metal ion. In some cases, the polarizable unit 130 includes rylenes such as naphthalene-1,8:4,5-tetracarboxylic diimides (NDIs), perylene-3,4,9,10-tetracarboxylic diimides (PDIs), terrylenetetracarboxylic diimides (TDI), quaterrylenetetracarboxylic diimides (QDI), pentarylene-tetracarboxylic diimides (5DI), and hexarylene tetracarboxylic diimides (HDI). In some cases, the polarizable unit can include quinones, flavins, acenes, heteroaromatic fused ring compounds, fullerenes, and graphene fragments.

Figure 1B:
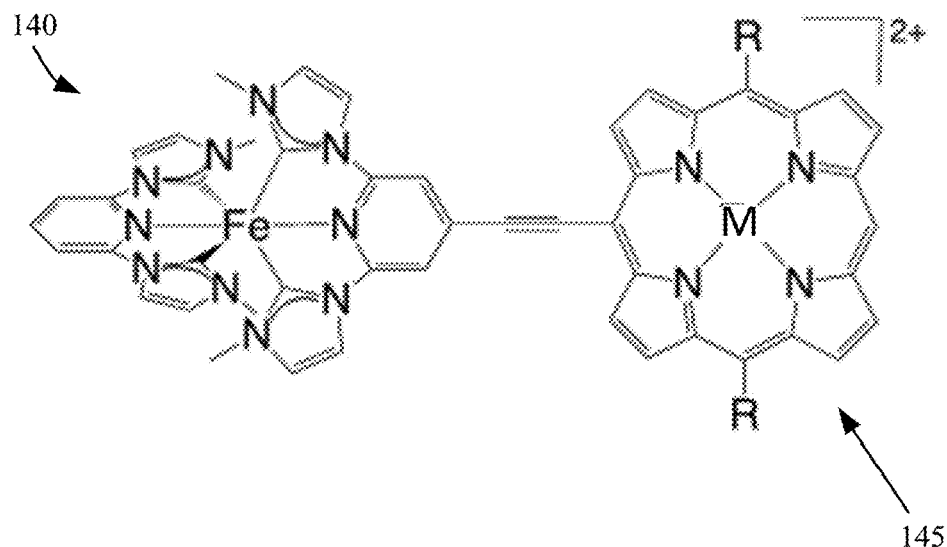
FIGS. 1B-1D illustrate example implementations of the iron-based photosensitizer compound of FIG. 1A.
Figure 1C:
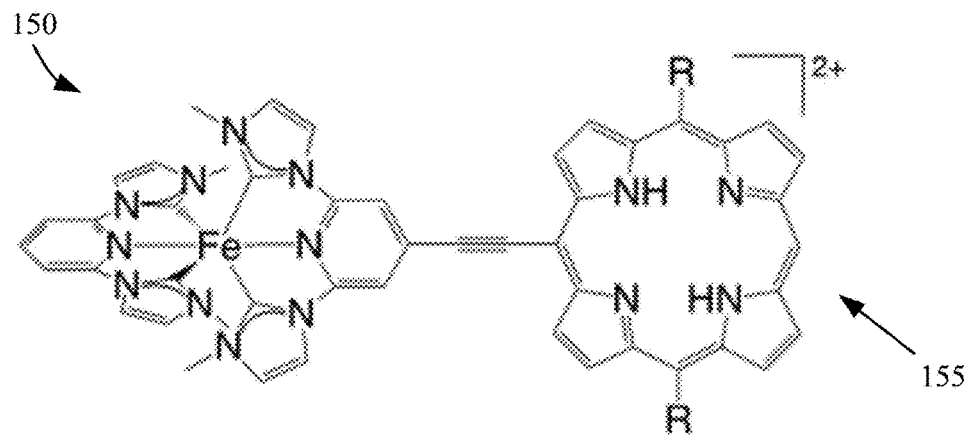
Figure 1D:
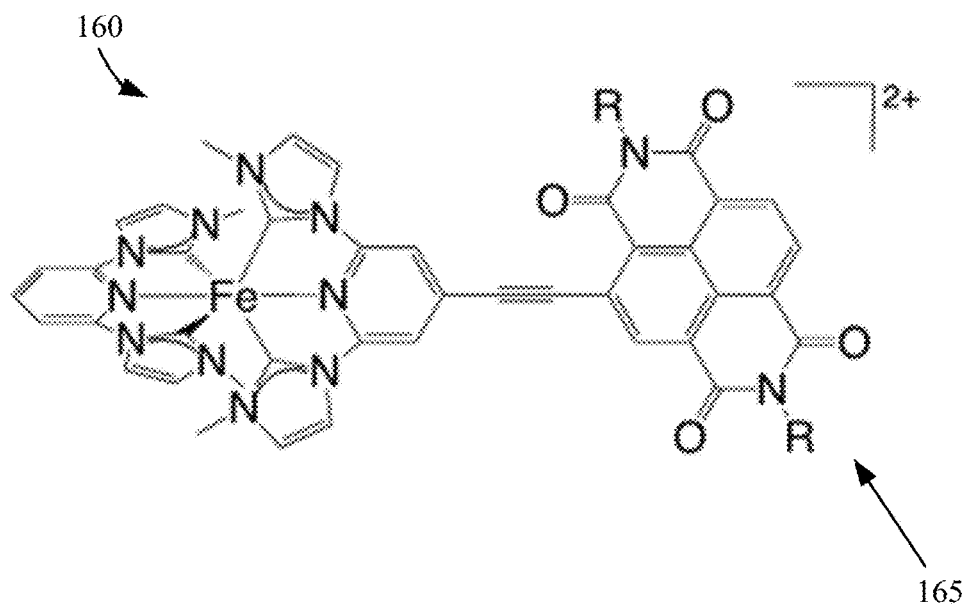

FIGS. 1B-1D illustrate example implementations of the iron-based photosensitizer compound of FIG. 1A. In the illustrated implementations, the FeNHC complex is $[Fe(tpy)_2]^{2+}$; however, as mentioned above, embodiments are not limited thereto.

FIG. 1B illustrates an iron-based photosensitizer with a metal porphyrin complex.

Referring to FIG. 1B, the photosensitizer compound 140 includes a polarizable unit of a pi conjugated structure having one-electron reduction potential more positive than NHC in the form of a metal porphyrin complex 145. M can be Zn, Mg, Cr, Fe, Co, Ni, Cu, Zr, Nb, Mo, Ru, Rh, Pd, Cd, Ge, Sn, Hf, Ta, W, Re, Os, Ir, Pt, Au, or Pb. In certain implementations, M is selected from Zn, Mg, Cu, Pd, and Pt. In certain implementations, M is selected from Zn and Mg. In a specific implementation described herein, M is Zn, with the polarizable unit containing M being Zn-porphyrin (PZn) and the photosensitizer compound thus being in the form of FeNHCPZn.

FIG. 1C illustrates an iron-based photosensitizer with a non-metal complex. Referring to FIG. 1C, the photosensitizer compound 150 includes a polarizable unit of a pi conjugated structure having one-electron reduction potential more positive than NHC in the form of a non-metal porphyrin 155.

FIG. 1D illustrates an iron-based photosensitizer with a rylene complex. Referring to FIG. 1D, the photosensitizer compound 160 includes a polarizable unit of a pi conjugated structure having one-electron reduction potential more positive than NHC in the form of a rylene complex 165 such as PDI.

Advantageously, the iron-based photosensitizer 100 can function as a light harvesting and injection material through tis extended metal-to-ligand charge-transfer lifetime and a large transition dipole moment difference between its ground and triplet MLCT ($^3$MLCT) states, as apparent by the proof of concept examples provided below.

Figure 2:
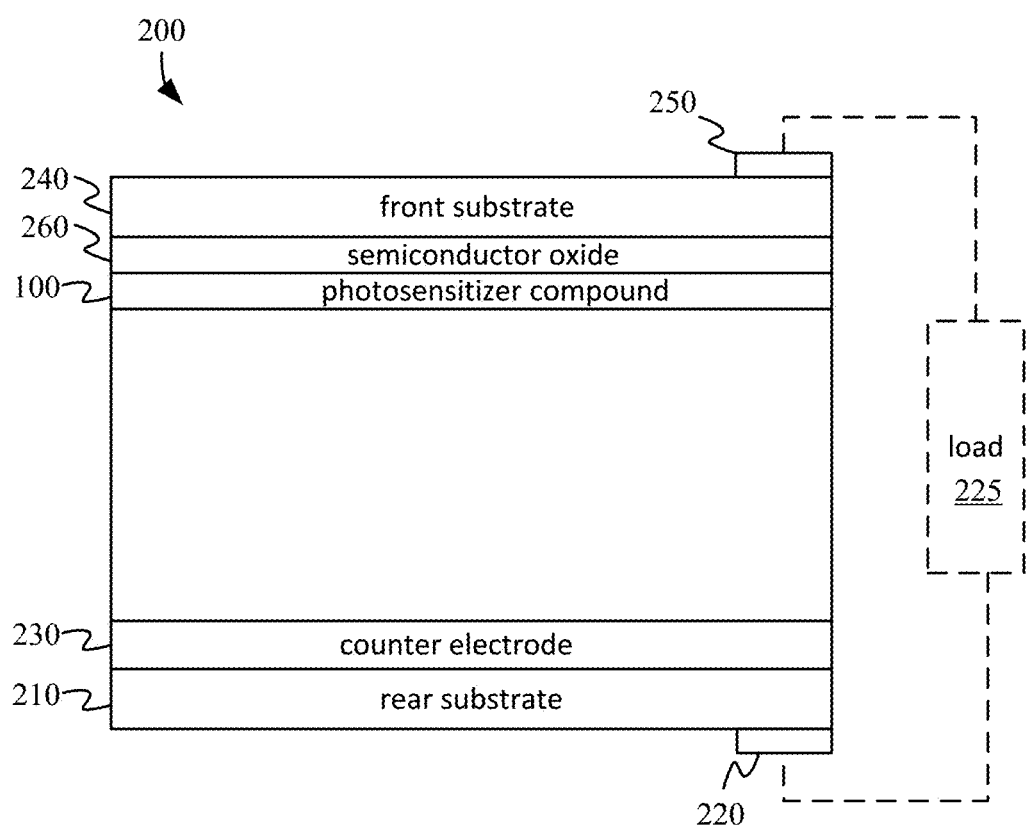
FIG. 2 illustrates an example application of the described photosensitizer compound in a dye-sensitized solar cell.

FIG. 2 illustrates an example application of the described photosensitizer compound in a dye-sensitized solar cell. Referring to FIG. 2, a dye-sensitized solar cell 200 incorporating the photosensitizer compound 100 can include a rear substrate 210 comprising conducting glass; a rear contact 220 at the rear substrate 210 for coupling the cell 200 to a load 225; a counter electrode 230 on the rear substrate 210; a front substrate 240 comprising conducting glass; a front contact 250 at the front substrate 240 for coupling the cell 200 to the load 225; a semiconductor oxide electrode 260 on the front substrate 240 and facing the rear substrate 210; and the photosensitizer compound 100 on the semiconductor oxide electrode 260. In some cases, the semiconductor oxide electrode 260 is formed of tin oxide.

Photoredox catalysts photochemically drive exceptional organic radical chemistry, providing new opportunities to design and elaborate unique constructs derived from olefinic and aromatic hydrocarbon building blocks that are not possible via conventional thermal reactions. For example, photoredox catalysts enable both oxidants and reductants to be transiently generated in the same reaction vessel, empowering the development of reaction schemes that require both oxidative and reductive steps at distinct junctures of a reaction mechanism, and circumventing substrate-to-product conversion strategies that rely on sequential use of stoichiometric oxidants and reductants.

The iron-based photosensitizer compound 100 can be used as a versatile catalyst for such photoredox catalysis applications. An example implementation of photosensitizer compound 100 is an Fe(II) chromophore based on bis(tridentate-ligand)metal(II)-ethyne-(porphinato)zinc(II) and bis(tridentate-ligand)metal(II)-ethyne-rylene diimide conjugated frameworks. Upon photoactivation, these chromophores, composed of inexpensive and earth-abundant $1^{st}$ row transition metals, produce metal-to-ligand charge-transfer (MLCT) states; such systems are poised to supplant conventional photoredox catalysts that are based on polypyridyl complexes of the precious metals ruthenium and iridium.

When such Fe-based photoredox take advantage of highly conjugated metallomacrocycle components such as PZn, new prospects exist to coordinate reactants, making possible light-triggered oxidations and reductions of reactants (or charge transfer relays) that are intramolecular in nature; in this respect, note that amines, alcohols, and heteroaromatics exhibit association constants that range from $10^2$-$10^4$ M$^{-1}$ with PZn. These classes of panchromatic, high absorptive oscillator strength photoredox catalysts based on earth-abundant elements will not only open up new avenues for novel bond-forming reactions involving conjugated organic substrates that trace ultimately their genesis to petroleum feedstocks: they also engender a new generation of catalysts with increased versatility as these agents may be excited at any UV-vis wavelength, ensuring utility no matter where solution reactants absorb light.

For the purposes of promoting an understanding of the principles of the present disclosure, reference will now be made to specific embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Accordingly, presented herein is a design for efficient iron-based photosensitizers, including an Fe(II) complex archetype, FeNHCPZn, which features a profoundly extended metal-to-ligand charge-transfer ($^3$MLCT) lifetime and a large transition-dipole moment difference between its ground and metal-to-ligand charge-transfer states. This supermolecular design promotes superior visible photon harvesting over classic metal complexes while assuring a triplet excited-state oxidation potential appropriate for charge injection into the conduction bands of common semiconductor electrode materials, highlighting its photosensitizing utility in dye-sensitized solar-cell architectures.

Exploiting earth-abundant iron-based metal complexes as high-performance photosensitizers demands long-lived electronically excited metal-to-ligand charge-transfer (MLCT) states, but these species suffer typically from femtosecond timescale CT-state quenching by low-lying nonreactive metal-centered (MC) states. Supermolecular Fe(II) chromophores based on the bis(tridentate-ligand)metal(II)-ethyne-(porphinato)zinc(II) conjugated framework, previously shown to give rise to highly delocalized low-lying $^3$MLCT states for other Group VIII metal (Ru, Os) complexes, were designed. Electronic spectral, potentiometric, and ultrafast pump-probe transient dynamical data demonstrate that a combination of a strong σ-donating tridentate ligand and a (porphinato)zinc(II) moiety with low-lying π* energy levels, sufficiently destabilize MC states and stabilize supermolecular MLCT states to realize Fe(II) complexes that express $^3$MLCT state photophysics reminiscent of their heavy metal analogues.

The resulting Fe(II) chromophore archetype, FeNHCPZn, features a highly polarized charge transfer state having a profoundly extended $^3$MLCT lifetime (160 ps), $^3$MLCT phosphorescence, and ambient environment stability. Density functional and domain-based local pair natural orbital coupled cluster [DLPNO-CCSD(T)] theory reveal triplet state wavefunction spatial distributions consistent with electronic spectroscopic and excited-state dynamical data, further underscoring the dramatic Fe metal-to-extended ligand CT character of electronically excited FeNHCPZn.

This design further prompts intense panchromatic absorptivity via redistributing high-energy absorptive oscillator strength throughout the visible spectral domain, while maintaining a substantial excited-state oxidation potential for wide-ranging photochemistry—highlighted by the ability of FeNHCPZn to photo-inject charges into a $SnO_2$/FTO electrode in a dye-sensitized solar cell (DSSC) architecture as shown in the proof of concept results described herein. Based on the described concepts, it can be seen that it is possible to replace traditional rare-metal-based emitters with iron-based photosensitizers for solar energy conversion and photoluminescence applications.

As will be demonstrated herein it is possible to realize long-lived (>ps) globally-delocalized low-lying MLCT states in highly-conjugated Ru(II)/Os(II) metal complexes based on the bis(terpyridyl)metal(II)-ethyne-(porphinato)zinc(II) supermolecular framework, wherein the bis(terpyridyl)metal(II) (M=Ru(II)/Os(II)) and (porphinato)zinc(II)(PZn) units are connected via an ethyne unit that bridges the 4'-terpyridyl and porphyrin macrocycle meso-carbon positions, aligning the respective low energy transition moments of these chromophoric building blocks in a head-to-tail arrangement. The nature of this chromophore-to-chromophore connectivity effectively mixes PZn π-π* and metal polypyridyl-based charge-resonance absorption oscillator strength, giving rise to (i) high-oscillator-strength long-wavelength absorption manifolds, and (ii) low-lying, long-lived (ps timescale) triplet states featuring highly polarized charge-separated (MLCT) character. For instance, in the Ru(II) archetype of this molecular framework (see FIG. 3A, RuPZn), a significantly extended $^3$MLCT lifetime of 43 µs is achieved that contrasts sharply the 250 µs $^3$MLCT lifetime of the Ru(tpy)$_2$ benchmark described in "Highly conjugated (polypyridyl)metal-(porphinato)zinc(II) compounds: Long-lived, high oscillator strength, excited-state absorbers having exceptional spectral coverage of the near-infrared" (Duncan et al., J. Am. Chem. Soc. 126, 9474-9475 (2004)) and "Molecular engineering of intensely near-infrared absorbing excited states in highly conjugated oligo(porphinato)zinc-(polypyridyl)metal(II) supermolecules" (Duncan et al., J. Am. Chem. Soc. 129, 9691-9703 (2007)).

Figure 3A:
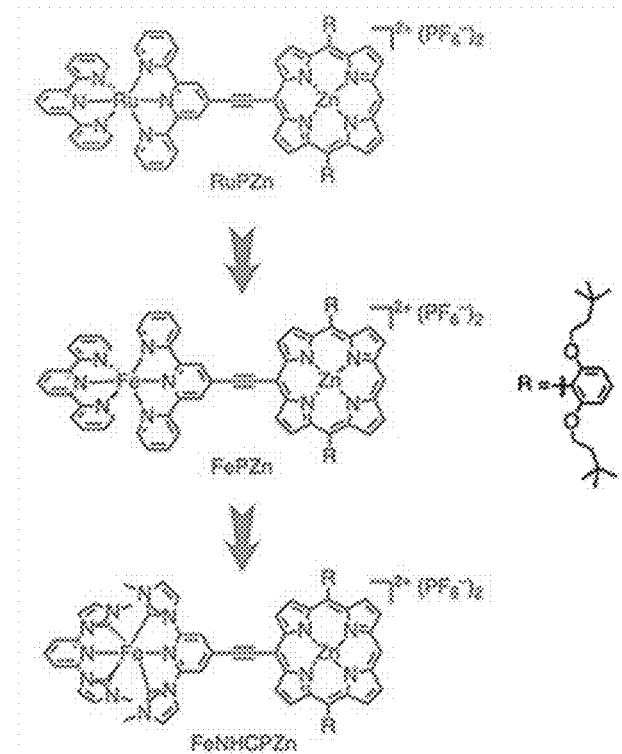
FIG. 3A shows a design flow of supermolecular Fe(II) complexes (FePZn, FeNHCPZn) that realize sub-nanosecond $^3$MLCT lifetimes and intensive visible-light absorption based on the RuPZn archetype and the bis(tridentate-ligand)metal(II)-(porphinato)zinc(II) framework.

FIG. 3A shows a design flow of supermolecular Fe(II) complexes (FePZn, FeNHCPZn) that realize sub-nanosecond $^3$MLCT lifetimes and intensive visible-light absorption based on the RuPZn archetype and the bis(tridentate-ligand)metal(II)-(porphinato)zinc(II) framework. Referring to FIG. 3A, the synthesis of two prototypical highly-conjugated Fe(II) complexes, FePZn and FeNHCPZn, Fe(II) analogues of RuPZn that also possess highly delocalized low-lying MLCT states and panchromatic absorptivity, are shown. The influence of excited-state interpigment electronic coupling and the nature of ligand electronic structure upon the ground-state absorptivity and excited-state relaxation dynamics are analyzed in these highly-conjugated Fe(II) supermolecular complexes. Spectroscopic data show that (i) both FePZn and FeNHCPZn manifest a ten-fold increase in visible spectral domain transition oscillator strength relative to that of classic Fe(II) complexes, and (ii) while the $^3$MLCT lifetime of FePZn differs little from that determined for [Fe(tpy)$_2$]$^{2+}$, FeNHCPZn exhibits nearly an order of magnitude amplification in $^3$MLCT lifetime (τ=160 ps) compared to the benchmark values of conventional air-stable Fe(II) complexes, and displays phosphorescence.

Figure 3B:
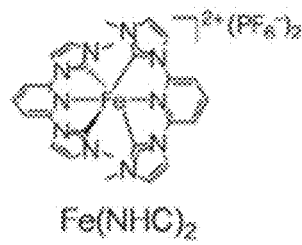
FIG. 3B shows a structure of a Fe(NHC)$_2$ benchmark complex; PF$_6^-$ units serve as counterions.
Figure 3C:
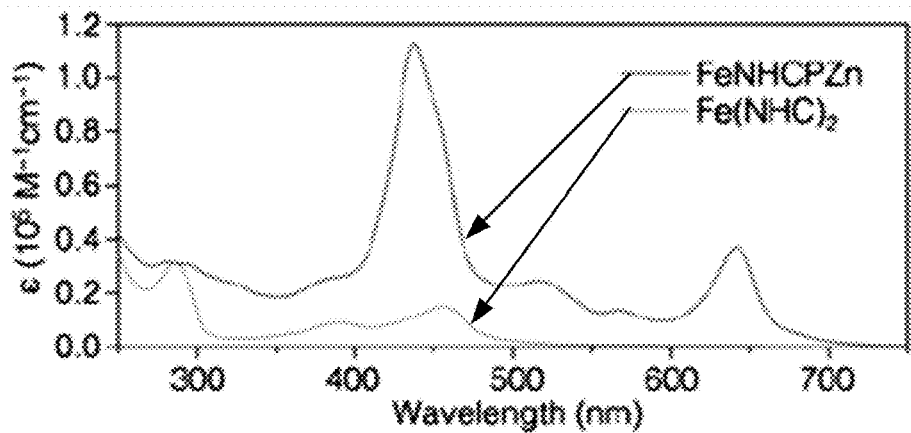
FIG. 3C shows an example comparison plot between the benchmark Fe(NHC)$_2$ and the subject FeNHCPZn of electronic absorption spectra over the 250-750 nm wavelength range.

FIG. 3B shows a structure of a Fe(NHC)$_2$ benchmark complex; $PF_6^-$ units serve as counterions. FIG. 3C shows an example comparison plot between the benchmark Fe(NHC)$_2$ and the subject FeNHCPZn of electronic absorption spectra over the 250-750 nm wavelength range. Referring to FIG. 3C, in Fe(NHC)$_2$, the 390 and 457 nm-centered bands feature Fe-to-NHC MLCT character, in FeNHCPZn, the 516 nm-centered band features Fe-to-PZn MLCT character. As can be seen, FeNHCPZn manifests vis spectral domain (400-750 nm) absorptive oscillator strength (fvis=1.66) one order of magnitude larger than that of the Fe(NHC)$_2$ benchmark (fvis=0.22). Note that FeNHCPZn features an intense absorption band centered at 438 nm with an extinction coefficient exceeding $10^5$ $M^{-1}cm^{-1}$, which is derived from the porphyrin $^1$π-π* (B-band) transition. The absorption band in the long-wavelength region of the spectrum exhibits substantial porphyrin $^1$π-π* Q-band character; its enhanced absorptive oscillator strength relative to simple PZn chromophores originates from symmetry breaking of the PZn in-plane electronic transitions and charge resonance interactions between the Fe(NHC)h and PZn units that are made possible by the ethyne bridge. Importantly, a new absorption band is also evident and displays significant Fe-to-PZn MLCT character (λmax=516 nm): this band is redshifted ~2500 cm$^{-1}$ relative to the Fe-to-NHC MLCT band (λmax=457 nm) of the Fe(NHC)$_2$ benchmark, underscoring the exceptional MLCT state stabilization made possible by ligand motif. While the labels "B", "Q", and "MLCT" are utilized for describing characteristic FeNHCPZn electronic absorption manifolds, these descriptors only denote the dominant character of these transitions, as PZn B and Q, and Fe(NHC)$_2$ MLCT electronic states mix extensively in FeNHCPZn. As can be seen, the panchromatic absorptivity of FeNHCPZn demonstrates the utility of this photosensitizer for light harvesting, especially with respect to the low-energy yellow and red spectral regions of the solar spectrum, which are commonly unabsorbed by conventional transition-metal complexes (11, 20, 23).

Figure 3D:
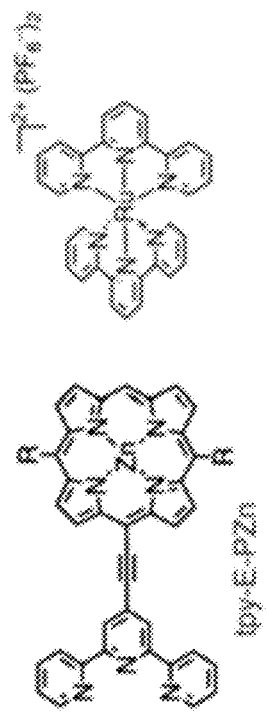
FIG. 3D shows electronic absorption spectra of RuPZn together with those of the Ru(tpy)$_2$ and tpy-E-PZn building blocks.
Figure 3D:
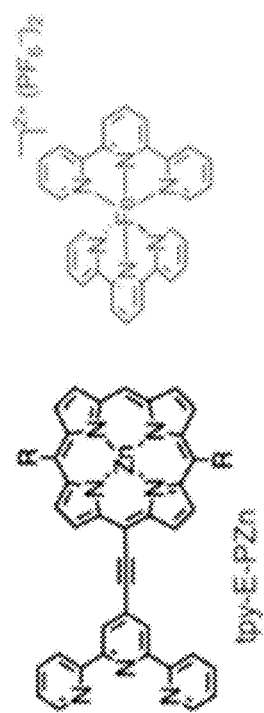
Figure 3D:
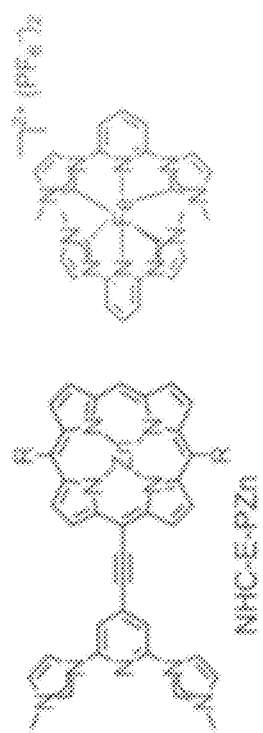
Figure 3D:
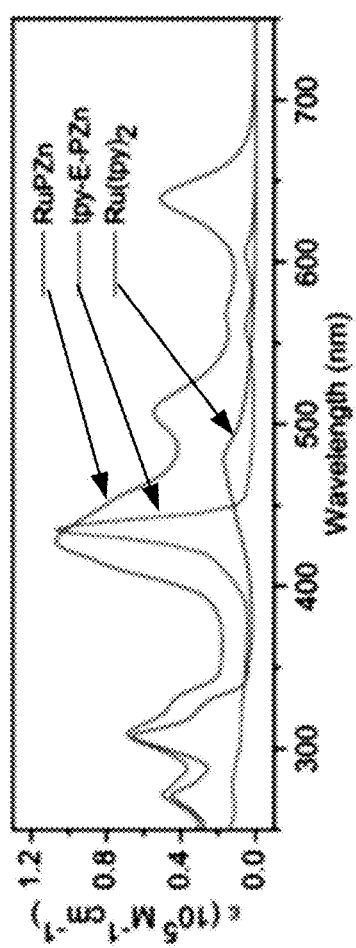
Figure 3E:
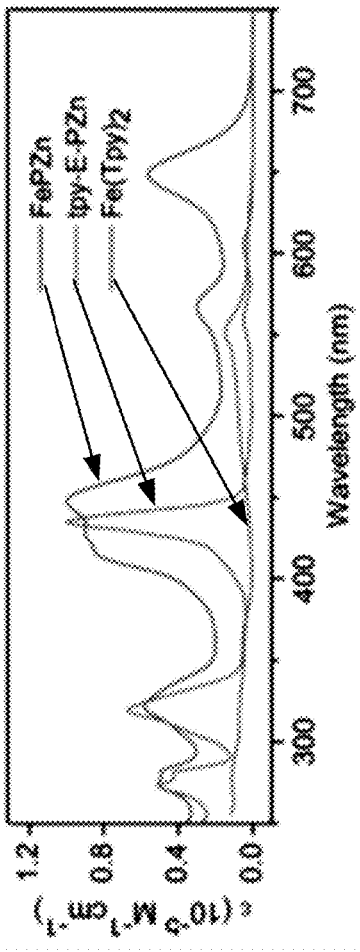
FIG. 3E shows electronic absorption spectra of FePZn together with those of the Fe(tpy)$_2$ and tpy-E-PZn building blocks.
Figure 3F:
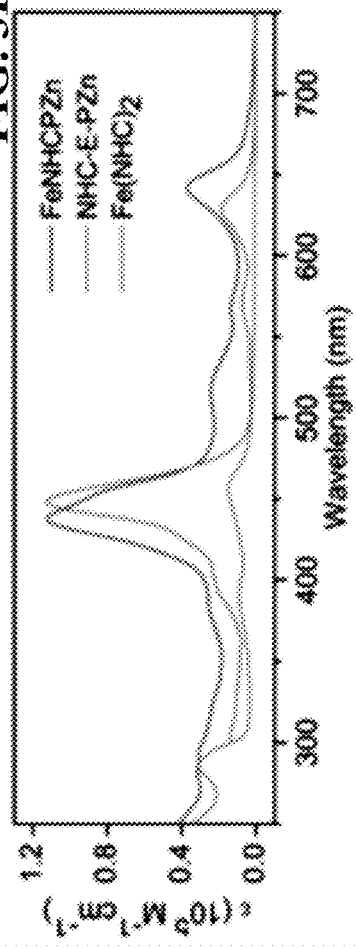
FIG. 3F shows electronic absorption spectra of FeNHCPZn together with those of the Fe(NHC)$_2$ and NHC-E-PZn building blocks.

FIG. 3D shows electronic absorption spectra of RuPZn together with those of the Ru(tpy)$_2$ and tpy-E-PZn building blocks; FIG. 3E shows electronic absorption spectra of FePZn together with those of the Fe(tpy)$_2$ and tpy-E-PZn building blocks; and FIG. 3F shows electronic absorption spectra of FeNHCPZn together with those of the Fe(NHC)$_2$ and NHC-E-PZn building blocks. In FIGS. 3D-3F, spectra of all compounds were recorded in acetonitrile solvent, save NHC-E-PZn, which was recorded in methylene chloride. Note that the ordinates in these figure panels reflect the extinction coefficients of RuPZn FePZn, FeNHCPZn, Ru(tpy)$_2$, Fe(tpy)$_2$, and Fe(NHC)$_2$; tpy-E-PZn spectra are shown scaled respectively to the RuPZn and FePZn spectra of FIG. 3D and FIG. 3E, and the NHC-E-PZn spectrum is shown scaled to that for FeNHCPZn in FIG. 3F, for comparative purposes.

Figure 12A:
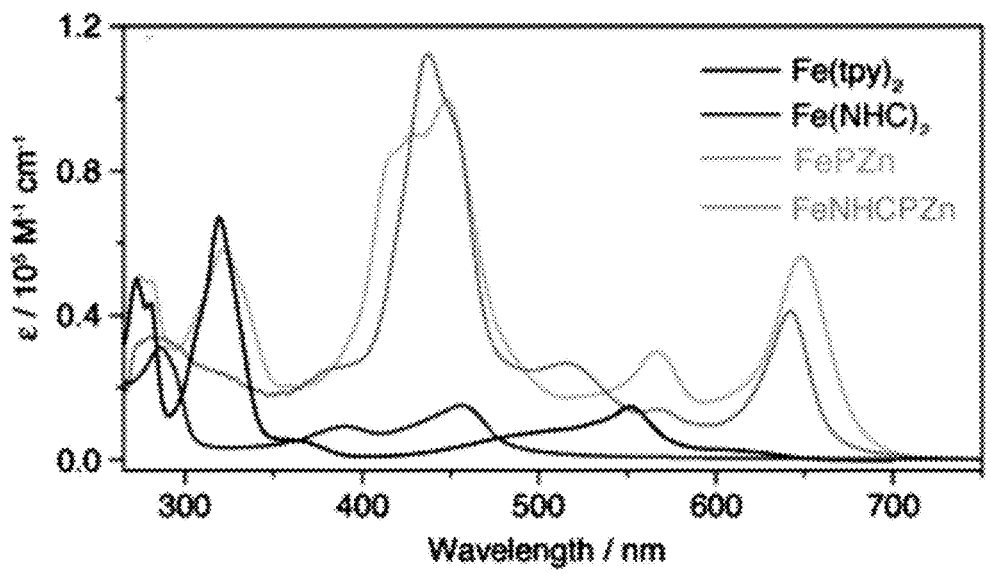
FIG. 12A shows electronic absorption spectra of Fe(tpy)$_2$, Fe(NHC)$_2$, FePZn, and FeNHCPZn in acetonitrile solvent.
Figure 12B:
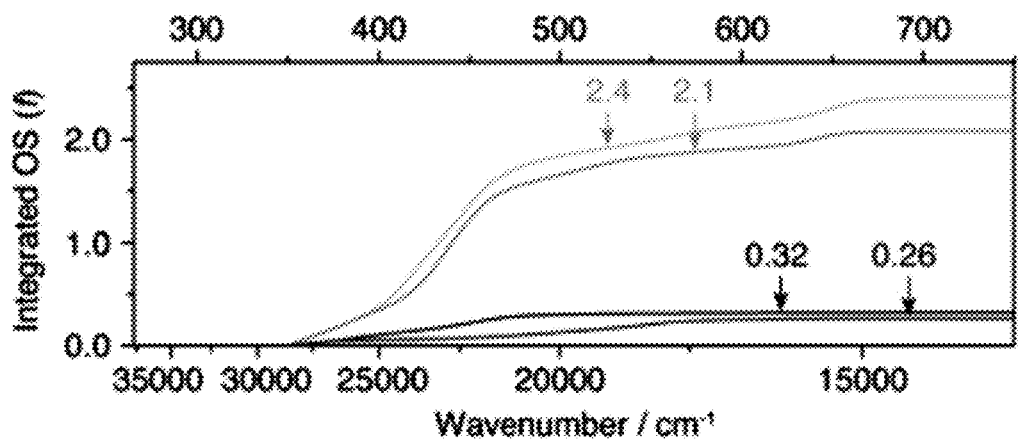
FIG. 12B shows total integrated absorptive oscillator strengths calculated over the 28571 cm$^{-1}$ (350 nm) to 13333 cm$^{-1}$ (750 nm) spectral range.

Molecular Design and Electronic Absorption Spectroscopy. In detail, FePZn (FIG. 3E) and FeNHCPZn (FIG. 3F) manifest panchromatic absorption resulting from intense mixing of FeL$_2$ (L=tpy or NHC) MLCT and PZn B- and Q-excited states, in resemblance to the previously established RuPZn system (FIG. 3D). Both Fe(II) supermolecules feature an intense absorption band centered at ~440 nm with an extinction coefficient exceeding $10^5$ M$^{-1}$cm$^{-1}$; this manifold derives from mixing of the porphyrin (TIPS-E-PZn, structure shown in FIGS. 3D and 3E) $^1\pi$-$\pi$* B-($\lambda_{max}$=426 nm) and FeL$_2$ MLCT states. The prominent absorption band in the long-wavelength region (550~700 nm) of these FePZn and FeNHCPZn spectra (FIGS. 3E and 3F) exhibits substantial tpy-E-PZn or NHC-E-PZn $^1\pi$-$\pi$* Q-band (550~650 nm) character; the enhanced absorptive oscillator strength of this manifold relative to those characteristic of simple porphyrin chromophores originates from symmetry breaking of the PZn in-plane electronic transitions and charge resonance interactions between the FeL$_2$ and PZn units that are made possible by the ethyne bridge. Apart from these transitions featuring substantial PZn-derived oscillator strength, note that the absorption band displaying significant MLCT character in the RuPZn (526 nm) spectrum (FIG. 3D) is also prominent in the FePZn and FeNHCPZn absorption spectra, centered respectively at 567 and 516 nm. The redshifts of these MLCT transition band maxima of the Fe(II) supermolecules relative to those of the conventional FeL$_2$ benchmarks underscore the extent to which this state is stabilized by the π-expanded PZn-containing ligand motif. While "B", "Q", and "MLCT" labels are utilized for describing electronic absorption manifolds characteristic of RuPZn, FePZn, and FeNHCPZn, these descriptors only denote the dominant character of these transitions, as PZn B and Q, and metal complex MLCT electronic states mix extensively in these supermolecules; because the nature of conjugation in these chromophores aligns the ML$_2$ and PZn transition dipoles in a head-to-tail arrangement, extensive excited-state interpigment electronic communication is enforced that drives significant CT character in each of these lowest three singlet excited states. Integrated absorptive oscillator strengths of FePZn and FeNHCPZn over the 400-750 nm spectral range (see FIG. 12B which shows total integrated absorptive oscillator strengths calculated over the 28571 cm$^{-1}$ (350 nm) to 13333 cm$^{-1}$ (750 nm) spectral range; see also FIG. 12A which shows electronic absorption spectra of Fe(tpy)$_2$, Fe(NHC)$_2$, FePZn, and FeNHCPZn in acetonitrile solvent) are one order of magnitude higher than those of Fe(tpy)$_2$ and Fe(NHC)$_2$, emphasizing that FePZn and FeNHCPZn are much better visible light absorbers, especially with respect to the low-energy yellow and red spectral regions of the solar spectrum, which are commonly unabsorbed by conventional transition-metal sensitizers used in DSSCs.

Despite that FePZn and FeNHCPZn exhibit analogous electronic absorptive spectral signatures (see FIGS. 3E and 3F), note that the FeNHCPZn supermolecule highlights a substantial degree of MLCT transition stabilization relative to the FeNHC building block: the FeNHCPZn MLCT band (516 nm) is red-shifted 2500 cm$^{-1}$ relative to that for Fe(NHC)$_2$ (457 nm); in contrast, the FePZn MLCT band (567 nm, overlapped with the PZn derived y-polarized Q band) redshifts only 480 cm$^{-1}$ with respect to the Fe(tpy)$_2$ MLCT band (552 nm). This picture is congruent with the relative LUMO energy levels of tpy, NHC, and PZn as probed by potentiometric and computational methods.

Figure 4A:
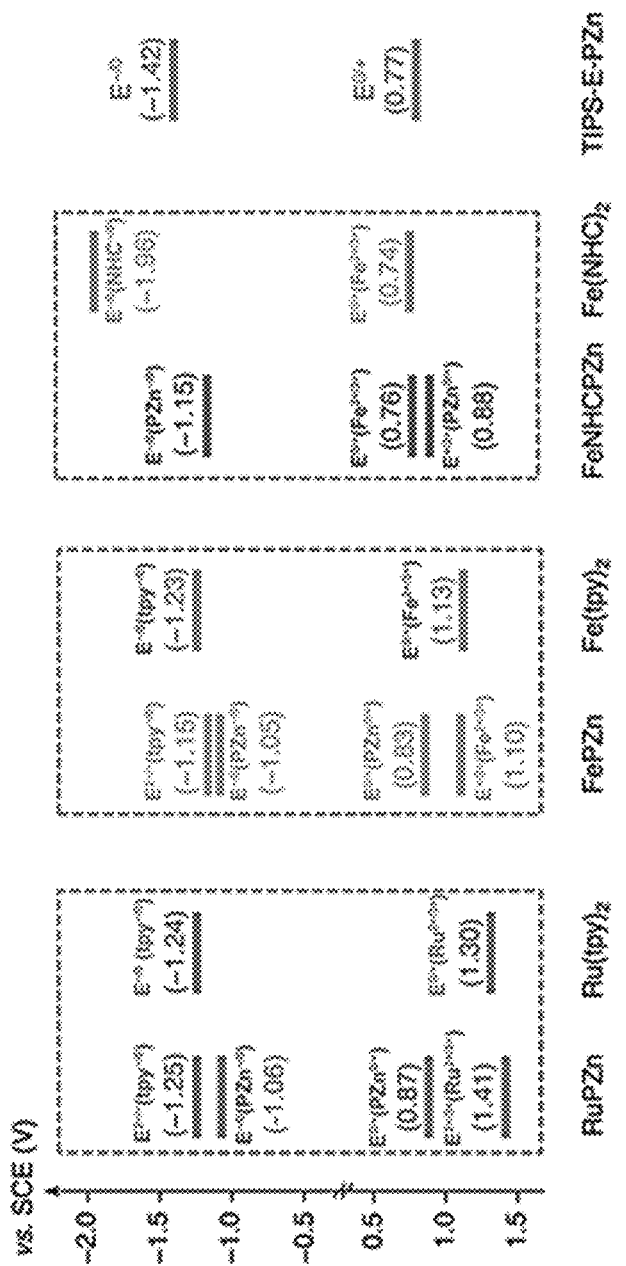
FIG. 4A shows a comparison of redox potentials (vs. SCE) of RuPZn, FePZn, and FeNHCPZn, together with those of the Ru(tpy)$_2$, Fe(tpy)$_2$, Fe(NHC)$_2$ and TIPS-E-PZn building blocks.

Potendometric Properties. FIG. 4A shows a comparison of redox potentials (vs. SCE) of RuPZn, FePZn, and FeNHCPZn, together with those of the Ru(tpy)$_2$, Fe(tpy)$_2$, Fe(NHC)$_2$ and TIPS-E-PZn building blocks. $E^{x/y}$ denotes the overall redox state of the corresponding supramolecular structure, while information followed in parentheses highlights the key structural motif being oxidized/reduced. Experimental conditions: 0.1 M [(n-C$_4$H$_9$)$_4$N][PF$_6$], T=20° C.; RuPZn, FePZn, FeNHCPZn, Ru(tpy)$_2$, Fe(tpy)$_2$, and Fe(NHC)$_2$—CH$_3$CN solvent, TIPS-E-PZn—CH$_2$Cl$_2$ solvent. With reference to FIG. 4A (and FIGS. 11A-11D), oxidative and reductive electrochemical data indicate that for Ru—PZn (25), FePZn, and FeNHCPZn, the observed anodic and cathodic potentiometric responses trace their genesis to established bis(ligand)metal (Ru/FeL$_2$)- and PZn-redox processes, indicating that the singly and doubly oxidized- and reduced-ground states of these species correspond to cation and anion states that are localized predominantly on the building block chromophores of these supermolecules. The potentiometric data provide insight into MLCT and MC states energy levels, and the nature of electronic transition polarization in these supermolecules. Note in this regard that: (i) the E(Fe$^{2+/3+}$) values of both Fe(II) supermolecules are almost identical to their FeL$_2$ benchmarks, indicating that the σ-donating/π-accepting properties of the tpy/NHC ligand motifs (and thus the MC state energy levels) are unperturbed despite being linked to a highly-conjugated PZn π-framework, and (ii) FeNHCPZn manifests PZn$^{-/0}$-based reduction potential (E$_{1/2}^{-1}$=−1.15 V) at significantly higher potential than the E$_{1/2}^{-/0}$ value for Fe(NHC)$_2$ (−1.96 V) (17), contrasting the nature of the E$^{-/0}$ and E$^{2-/-}$ redox processes for FePZn. With respect to this latter point, note that the E$^{2-/-}$ redox process for FeNHCPZn that would localize substantial electron density on the Fe(NHC)$_2$ fragment, lies outside the solvent window afforded by acetonitrile solvent. These potentiometric data are thus congruent with a picture that emphasizes that while the MLCT state of FePZn will feature electron density polarized toward the tpy moiety, the corresponding MLCT state of FeNHCPZn will have a much greater transition moment, with electron density delocalized substantially on the conjugated PZn macrocycle (vide infra). The similarity of FeNHCPZn potentiometric ($\Delta E_p$=[E$_{1/2}$(Fe$^{2+/3+}$)−E$_{1/2}$(L$^{0/-}$)]) and optical ($\Delta E_{op}$) bandgaps underscores this point. $\Delta E_p$ for FeNHCPZn (1.91 eV) is diminished 0.79 V relative to that for Fe(NHC)$_2$ (2.70 eV), much larger than the corresponding 0.21 eV drop in the magnitude of $\Delta E_p$ manifested for FePZn relative to Fe(Tpy)$_2$. $\Delta E_p$(FeNHCPZn) matches the energy of its lowest energy optical transition energy ($\Delta E_{op}$=642 nm; 1.93 eV) emphasizing that electronic excitation gives rise to low-lying excited state having substantial CT character.

Figure 4B:
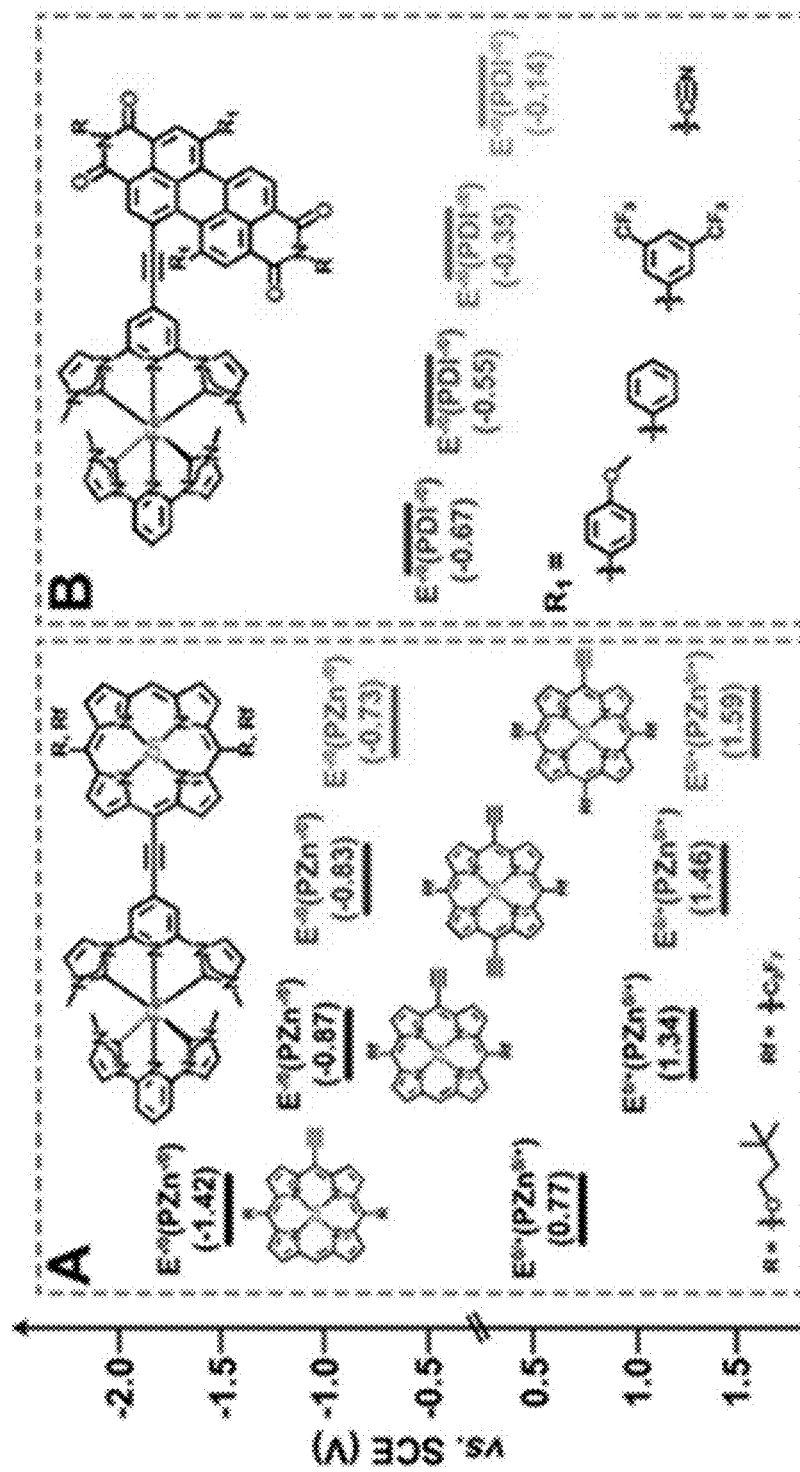
FIG. 4B shows redox potentials (vs. SCE) of (porphinato) zinc(II) derivates (A) and PDI derivates (B) displaying redox potential modulation over ~700 mV and ~400 mV for PZn and PDI, respectively.

FIG. 4B shows redox potentials (vs. SCE) of (porphinato)zinc(II) derivates (A) and PDI derivates (B) displaying redox potential modulation over ~700 mV and ~400 mV for PZn and PDI, respectively. Referring to FIG. 4B, two photoredox catalysts are shown, FeNHC-rylene and Fe(NHC)—(C$_3$F$_7$)$_n$PZn compositions. For example, systematic addition of highly σ-withdrawing, non-a-conjugating perfluoroalkyl substituents facilitates modulation of reduction and oxidation potentials across a ~700 mV range for FeNHC—(C$_3$F$_7$)$_n$PZn (A). Similarly, altering the substituents in the bay region of the perylene diimide (PDI) chromophore (B) enables modulation of the rylene E$^{-/0}$ potential over a ~400 mV domain. Note that the broader family of rylene diimide dyes [e.g., pyromellitic diimide (PI), perylene-monoimide (PMI), naphthalene diimide (NDI), terrylene diimide (TDI)], combined with the ability to electronically modulate both the dye (e.g., porphyrin, rylene) and NHC frameworks, provide roadmaps to extensively regulate $^3E^{-/*}$ and $^3E^{*/+}$ potentials and $^3MLCT$ lifetimes.

Excited-State Dynamics. FIGS. 5A-5F show representative ultrafast pump-probe spectra recorded at several time delays, and exemplary kinetic traces at key probe wavelengths for RuPZn (FIGS. 5A and 5B), FePZn (FIGS. 5C and 5D), and FeNHCPZn (FIGS. 5E and 5F). Experimental conditions: solvent=MeCN; temperature=21° C.; magic angle polarization; $\lambda_{ex}$=650 nm for RuPZn and FeNHCPZn, $\lambda_{ex}$=670 nm for FePZn; $P_{ex}$=300 μW. FIG. 6A shows a Jablonski diagram illustrating the relative energetic arrangement of FePZn selected electronic states and corresponding excited-state relaxation dynamics; FIG. 6B shows a Jablonski diagram illustrating the relative energetic arrangement of FeNHCPZn selected electronic states and corresponding excited-state relaxation dynamics; FIG. 6C shows a plot of steady-state emission ($\lambda_{ex}$=532 nm, $P_{ex}$=1 mW) of FeNHCPZn in 1:1 MeCN:H$_2$O solvent at room temperature; and FIG. 6D shows a plot of time-resolved emission ($\lambda_{ex}$=405 nm) of FeNHCPZn in 1:1 MeCN:H$_2$O solvent at room temperature.

Figure 5A:
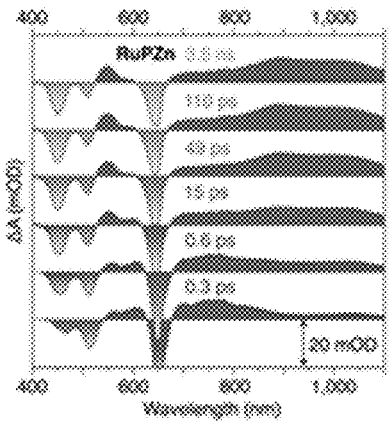
FIGS. 5A-5F show representative ultrafast pump-probe spectra recorded at several time delays, and exemplary kinetic traces at key probe wavelengths for RuPZn (FIGS. 5A and 5B), FePZn (FIGS. 5C and 5D), and FeNHCPZn (FIGS. 5E and 5F).
Figure 5B:
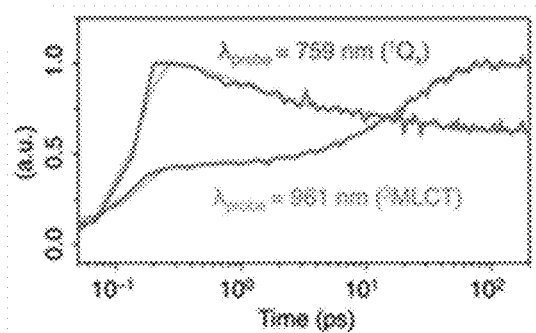
Figure 5C:
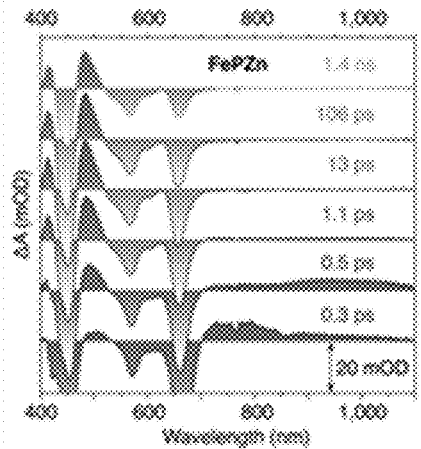
Figure 5D:
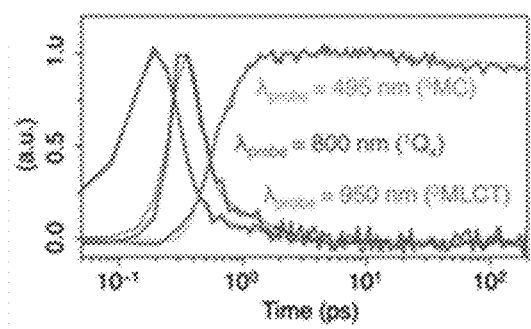
Figure 5E:
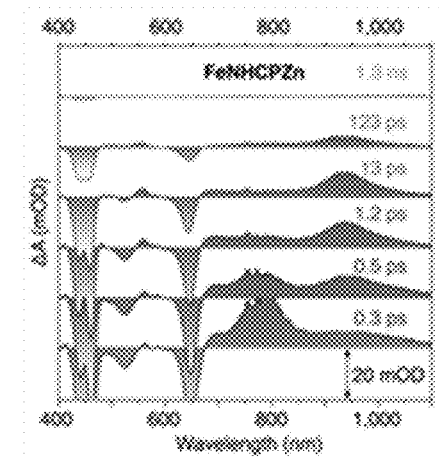
Figure 5F:
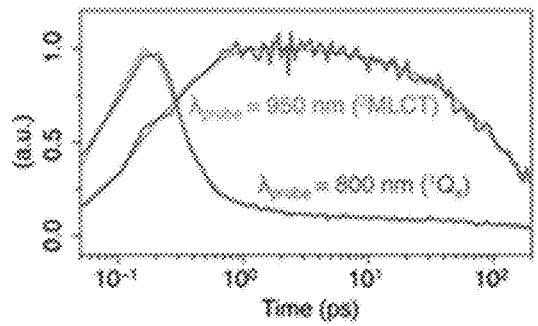
Figure 6A:
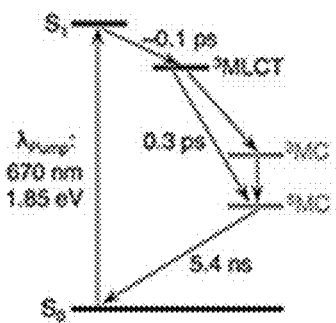
FIG. 6A shows a Jablonski diagram illustrating the relative energetic arrangement of FePZn selected electronic states and corresponding excited-state relaxation dynamics.
Figure 6B:
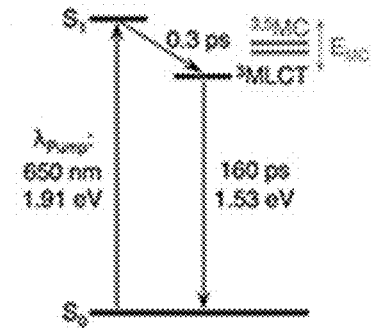
FIG. 6B shows a Jablonski diagram illustrating the relative energetic arrangement of FeNHCPZn selected electronic states and corresponding excited-state relaxation dynamics.
Figure 6C:
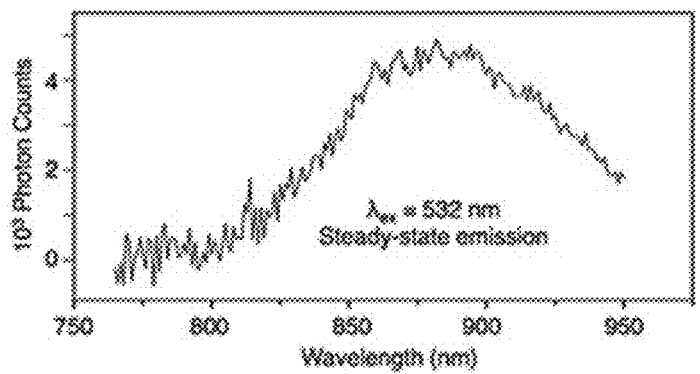
FIG. 6C shows a plot of steady-state emission ($\lambda_{ex}$=532 nm, $P_{ex}$=1 mW) of FeNHCPZn in 1:1 MeCN:H$_2$O solvent at room temperature.
Figure 6D:
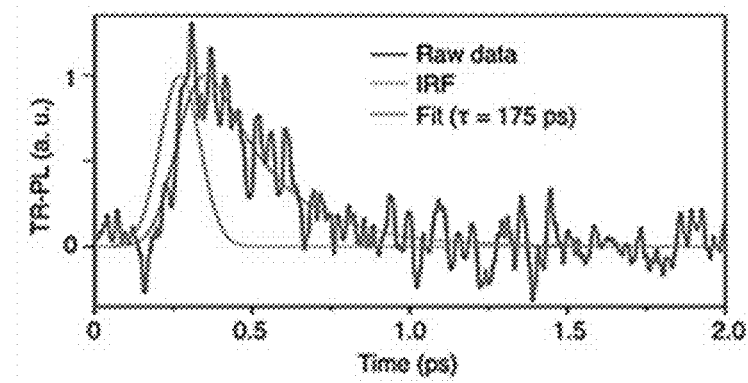
FIG. 6D shows a plot of time-resolved emission ($\lambda_{ex}$=405 nm) of FeNHCPZn in 1:1 MCCN:H$_2$O solvent at room temperature.

Ultrafast pump-probe transient absorption spectroscopic data acquired at early delay times (<1 ps) demonstrate that both FePZn and FeNHCPZn exhibit excited state absorption features similar to the features characteristic of bis(terpyridyl)metal(II)-ethyne-(porphinato)zinc supermolecules such as RuPZn (see FIGS. 5A and 5B). Immediately following $S_0 \rightarrow S_1$ photoexcitation, NIR transient absorption signals centered at ~780 nm are evident for both Fe(II) supermolecules (see FIGS. 5C and 5D). This low-energy NIR signal, absent in the early delay time transient absorption spectra of the NHC-ethyne-PZn ligand alone (see FIG. 14A), is characteristic of the $S_1 \rightarrow S_n$ absorptive manifold of the bis(terpyridyl)metal-ethyne-(porphinato)zinc supermolecules (see that of RuPZn in FIG. 5A). The decay of this $S_1 \rightarrow S_n$ absorptive manifold correlates with the rise of a new NIR transient absorptive signal centered at ~970 nm for FePZn and ~930 nm for FeNHCPZn, indicating the evolution of a new electronically excited state. This time-dependent transient spectral evolution is akin to that evinced for RuPZn, wherein this lower-energy NIR transient absorption signal has been shown to be a signature of an extensively delocalized low-lying triplet state having substantial MLCT character. In this regard, note that the FeNHCPZn NIR transient absorptive manifold centered at ~930 nm evinces positive solvatochromism with decreasing solvent polarity (see FIG. 15), corroborating the CT character of this excited state. For these reasons, coupled with substantial literature precedent, the transient absorption manifold centered in this low energy NIR spectral region (~970 nm for FePZn and ~930 nm for FeNHCPZn) is denoted as a $T_{MLCT} \rightarrow T_n$ transition, a spectroscopic hallmark of the MLCT state in these supermolecules; the rise time of this $T_{MLCT} \rightarrow T_n$ signal thus corresponds to $S_1 \rightarrow {}^3MLCT$ intersystem crossing dynamics ($\Sigma_{ISC}$ ~0.1 μs for FePZn and $\tau_{ISC}$=0.3 μs for FeNHCPZn).

However, at longer delay times (t>1 ps), while the excited state absorption features of FePZn resemble those of conventional Fe(II) complexes such as Fe(tpy)$_2$, FeNHCPZn spectral evolution shows remarkable correspondence to that manifest by the RuPZn benchmark, congruent with the fact that this ligand design realizes an Fe(II) complex that features a low-lying excited state that recapitulates the MLCT photophysics elucidated for (polypyridyl)metal(II)-ethyne-(porphinato)zinc(II) supermolecular chromophores that exploit the heavy metals ruthenium and osmium. In sharp contrast to FeNHCPZn, the FePZn $^3$MLCT state decays on an ultrafast timescale, accompanied by the rise of a new transient absorption signal having substantial oscillator strength over the ~450-500 nm spectral region, which lies to the red of the PZn-derived B band bleaching signal. Given that (i) this nascent transient absorption signal decays in a few nanoseconds, close to that for $^5$MC state lifetimes typical for Fe(tpy)$_2$ derivatives (17), and (ii) the transient signature associated with $^5$MC→$^n$MC* absorption (where $^n$NMC* denotes a higher lying, metal-centered electronically excited state) commonly lies to the red of the ligand-derived ground-state absorption bleaching signals, this transient absorption signal at ~450-500 nm is assigned as a FePZn $^5$MC→MC* transition. The transient absorptive signatures characteristic of the $S_1$, $^3$MLCT, and $^5$MC states, and their corresponding time-dependent spectral evolution, indicate that $^3$MLCT→$^5$MC conversion dominates FePZn $^3$MLCT state relaxation dynamics, and signifies that the $^3$MLCT state of FePZn lies higher in energy than these MC states. Note that FeNHCPZn relaxation dynamics stand in marked juxtaposition to those described for FePZn, as FeNHCPZn's $^3$MLCT NIR absorption decays simultaneously with the ground state recovery ($\Sigma_{3MLCT}$=160 ps; FIG. 5E; FIGS. 6A-6D), without the observance of any other new excited state absorption signals: this excited-state dynamical behavior is identical to that manifest by RuPZn. These data thus indicate that $^{3,5}$MC states play a negligible role in excited-state relaxation processes associated with the $^3$MLCT state of FeNHCPZn. As can be seen in FIGS. 6A and 6B, the Jablonski diagrams summarize the relative energetic arrangements of these FePZn and FeNHCPZn electronic states and their corresponding excited-state relaxation dynamics elucidated by pump-probe transient absorption spectroscopy and time-resolved emission experiments.

Electronic Structural Studies. DFT calculations that reveal frontier orbital energy levels, the nature of singly occupied molecular orbitals (SOMOs) that describe electronically excited triplet and quintet states, the spatial distribution of excited-state wavefunctions, and the magnitudes of FePZn and FeNHCPZn ground- and excited-state dipole moments, corroborate conclusions derived from electronic spectral, potentiometric, and time-resolved transient dynamical data. These comprehensive DFT computational studies exploit three different DFT functionals (M06L, B3LYP, and TPSSh); results stemming from these computations were further verified using domain-based local pair natural orbital coupled cluster (DLPNO-CCSD(T)) theory. These latter computational studies are particularly significant as DLPNO-CCSD(T) theory is designed to reproduce ~99.9% of the canonical correlation energy, and defines the present quantum mechanical "gold-standard" for determining molecular state energies.

TABLE 1

Ground-state singlet ($S_0$), and electronically excited triplet ($T_1$) and quintet ($Q_1$)
state energetic minima (eV), computed using DFT and coupled cluster theory.

|  | FePZn | | | FeNHCPZn | | | |
| --- | --- | --- | --- | --- | --- | --- | --- |
|  | B3LYP | TPSSh | M06L | B3LYP | TPSSh | M06L | CCSD(T) |
| $S_0$ | 0.00 | 0.00 | 0.00 | 0.00 | 0.00 | 0.00 | 0.00 |
| $T_1$ | 0.72 | 0.87 | 0.83 | 1.35 | 1.36 | 1.29 | 1.95 |
| $Q_1$ | 0.23 | 0.43 | 0.50 | 3.05 | 3.04 | 2.75 | 3.70 |

Figure 7A:
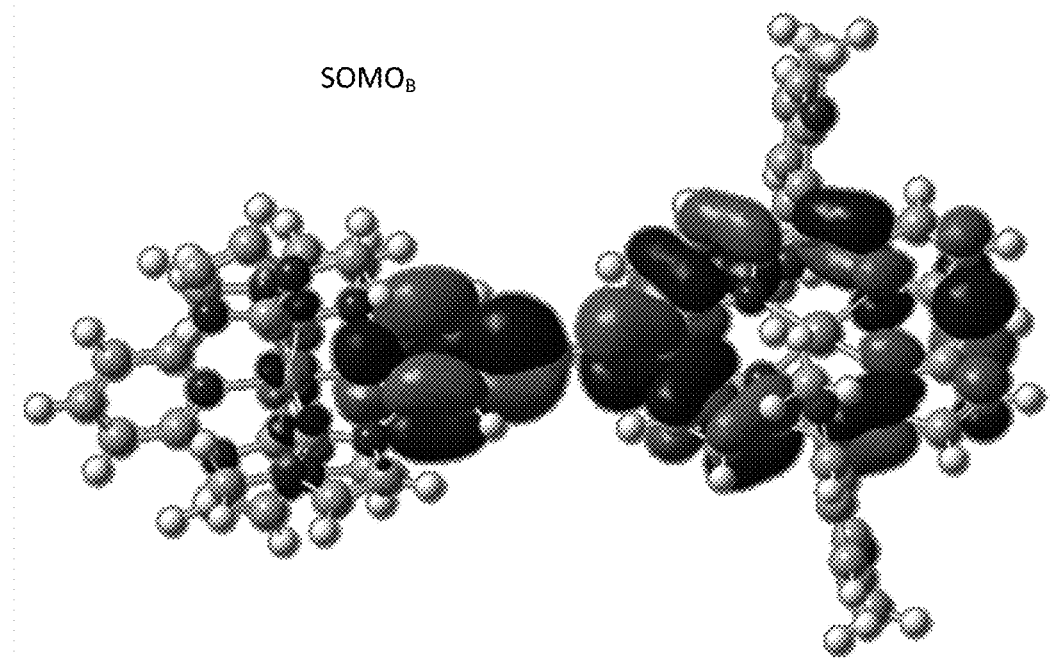
FIGS. 7A and 7B show B3LYP-computed singly occupied molecular orbitals (SOMOs) of the FeNHCPZn T$_1$ state.
Figure 7B:
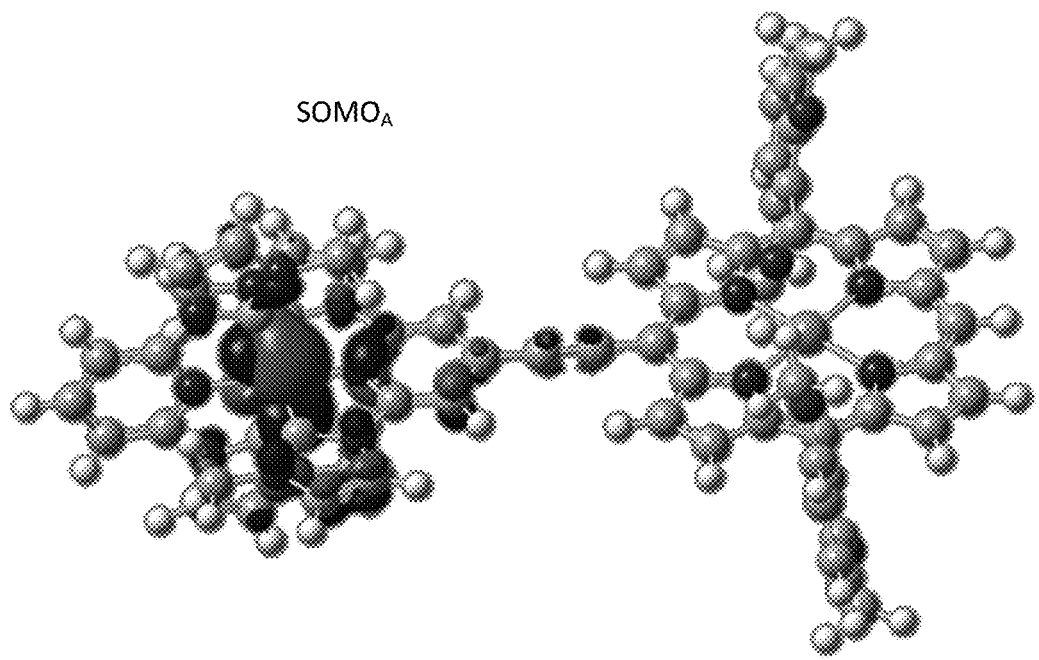

Table 1 displays the ground-state singlet, and electronically excited triplet ($T_1$) and quintet ($Q_1$) state energetic minima (eV), computed using DFT and DLPNO-CCSD(T) theory for FePZn and FeNHCPZn. Note that for FePZn, the calculated lowest $Q_1$ state energy is lower than its $T_1$ state energy, mirroring the ultrafast pump-probe transient dynamical results shown in FIGS. 5A-5F; in contrast, for FeNHCPZn, this picture is reversed—the calculated FeNHCPZn $T_1$ state resides much lower energy than its $Q_1$ state. The SOMOs that describe the FeNHCPZn $T_1$ state are shown in FIGS. 7A and 7B, with FIG. 7A showing $SOMO_B$ and FIG. 7B showing $SOMO_A$; note that $SOMO_A$ shows electron density localized primarily at the Fe metal center, while $SOMO_B$ depicts electron density delocalized over the extended NHC-ethyne-PZn ligand framework, with the lion's share of electron density concentrated on the porphyrin macrocycle. These SOMOs highlight the intense MLCT character of the FeNHCPZn $T_1$ state.

cence from FeNHCPZn is observed. As shown in FIG. 6C, photoexcitation of FeNHCPZn in a 1:1 MeCN:$H_2O$ solvent mixture gives rise to weak room-temperature photoluminescence centered at 880 nm. In addition, as shown in FIG. 6D, time-correlated single photon counting determines a photoluminescence lifetime of 175 ps, in close agreement with the 160 ps $^3$MLCT lifetime acquired from ultrafast pump-probe spectroscopic data. The magnitudes of these matched lifetimes, coupled with the energy separation between the absorption and emission band maxima (Stokes shift=3076 cm$^{-1}$) are consistent with assignment of the FeNHCPZn photoluminescence as phosphorescence resulting from a $^3$MLCT→$S_0$ radiative transition; note that the magnitude of this Stokes shift resembles that evinced for RuPZn phosphorescence. Despite the weak nature of this room temperature phosphorescence, these data (i) provide an important measure of the $^3$MLCT state energy ($E_{0,0}$=810 nm=1.53 eV) and (ii) demonstrate direct $^3$MLCT→$S_0$ photoluminescence

TABLE 2

B3LYP-computed dipole moment components (X, Y, Z; Debye) of the
ground and lowest energy triplet and quintet states for FePZn and FeNHCPZn; here the Fe—Zn
axis is defined as the x-direction. The large dipole moment difference between the FeNHCPZn $T_1$
and $S_0$ states underscores the MLCT nature of its lowest energy electronically excited triplet state.
Similar dipole moment magnitude changes between these FePZn and FeNHCPZn ground and
excited states were obtained using TPSSh and M06L functionals.

|  | FePZn | | | FeNHCPZn | | |
| --- | --- | --- | --- | --- | --- | --- |
|  | X | Y | Z | X | Y | Z |
| $S_0$ | 58.33 | −0.01 | 0.23 | 58.52 | −0.02 | 0.13 |
| $T_1$ | 58.40 | 0.00 | 0.14 | 88.11 | 0.14 | 0.21 |
| $Q_1$ | 57.47 | 0.02 | 0.17 | 94.33 | 0.14 | 0.16 |

Table 2 highlights computational data that characterize the dipole moment magnitudes of the ground and lowest energy triplet and quintet states for FePZn and FeNHCPZn. While the lowest energy $T_1$ and $Q_1$ states of FePZn reflect dipole moments that resemble its $S_0$ state, the FeNHCPZn lowest energy $T_1$ and $Q_1$ states manifest dipole moments 30 Debye greater than that of its ground state. See also FIG. 19. These computational analyses reinforce the FIGS. 6A and 6B Jablonski diagrams derived from experiment, and emphasize the diminished roles played by MC states in FeNHCPZn excited-state relaxation dynamics. As FeNHCPZn $T_1$ state electron density is extensively polarized towards the PZn unit of the ligand framework, this $^3$MLCT state concomitantly minimizes $^3$MLCT-$^{3,5}$MC and $^3$MLCT-$S_0$ wavefunction overlap relative to that characteristic of many benchmark photosensitizers, driving the long $^3$MLCT state lifetime of FeNHCPZn.

Owing to the substantially extended FeNHCPZn $^3$MLCT lifetime relative to that of FePZn and other conventional Fe(II) complexes, supermolecular $^3$MLCT→$S_0$ phosphoresfrom an Fe(II) complex using a conventional excitation source that does not employ fluorescence upconversion experimental methods. Moreover, these transient absorptive and emission experiments establish that FeNHCPZn is extraordinarily robust, as no evidence of photobleaching is observed in any of these ambient temperature photophysical experiments.

Beyond these excited-state dynamical and electronic structural properties, the promising utility of FeNHCPZn is also highlighted by the relative energetic arrangement between its triplet excited-state oxidation potential ($^3E^*_{+/}$) and the conduction bands (CBs) of widely exploited semiconductor electrode materials.

Figure 8A:
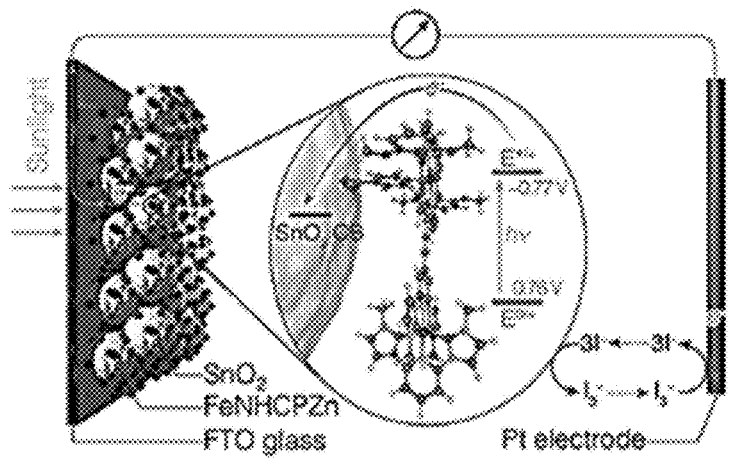
FIG. 8A shows a schematic diagram of a DSSC architecture that exploits the FeNHCPZn/SnO$_2$/FTO photoelectrode.
Figure 8B:
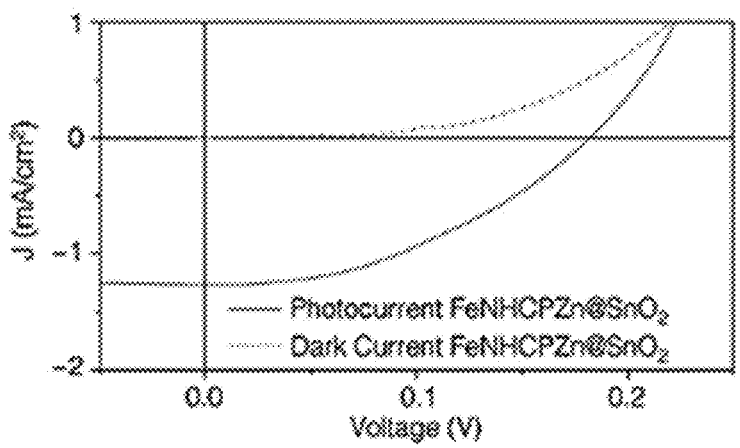
FIGS. 8B and 8C show J-V responses obtained for the FeNHCPZn/SnO$_2$/FTO photoelectrode and bare SnO$_2$/FTO photoelectrode, respectively, under dark and AM 1.5 G illumination.
Figure 8C:
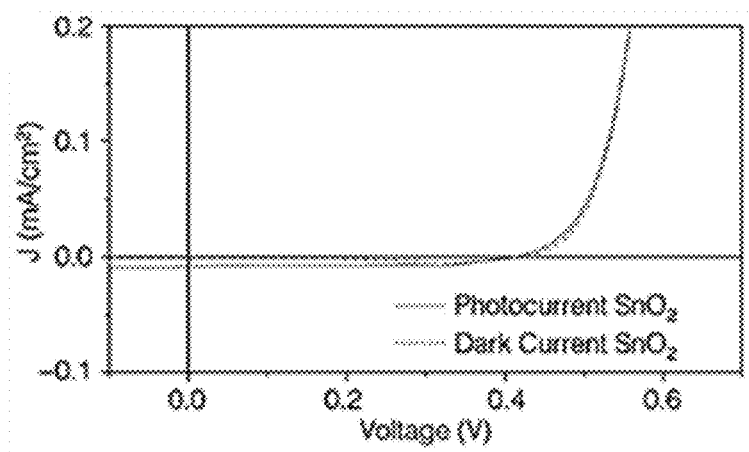
Figure 17A:
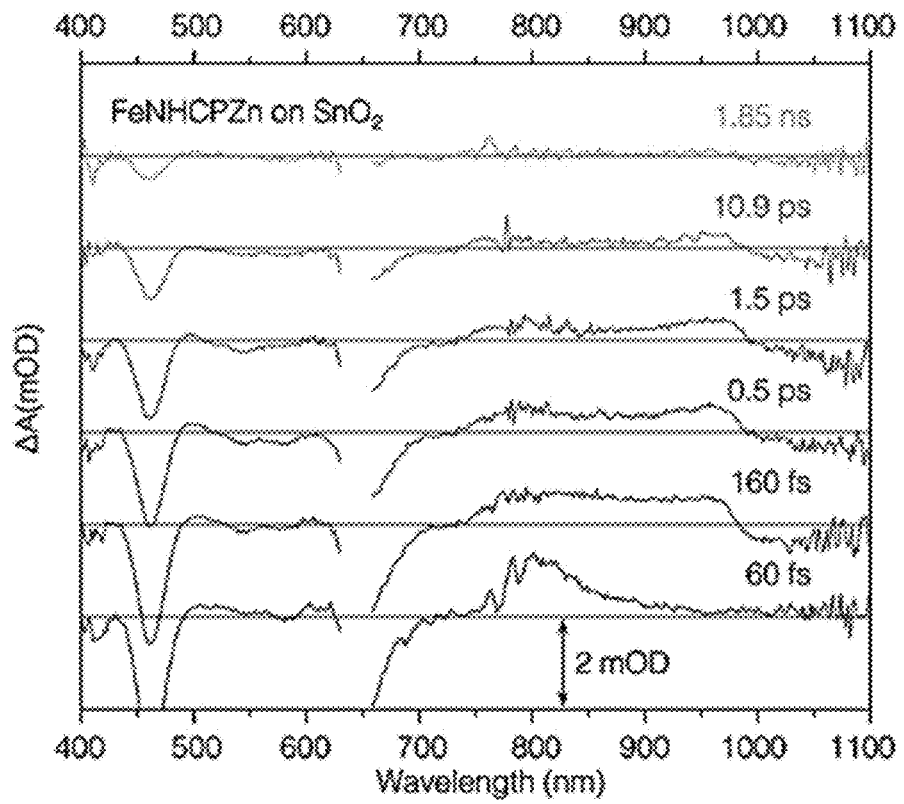
FIG. 17A shows representative pump-probe spectra recorded at various delay times for FeNHCPZn on SnO$_2$ surfaces ($\lambda_{ex}$=640 nm; $P_{ex}$=310 μW).
Figure 17B:
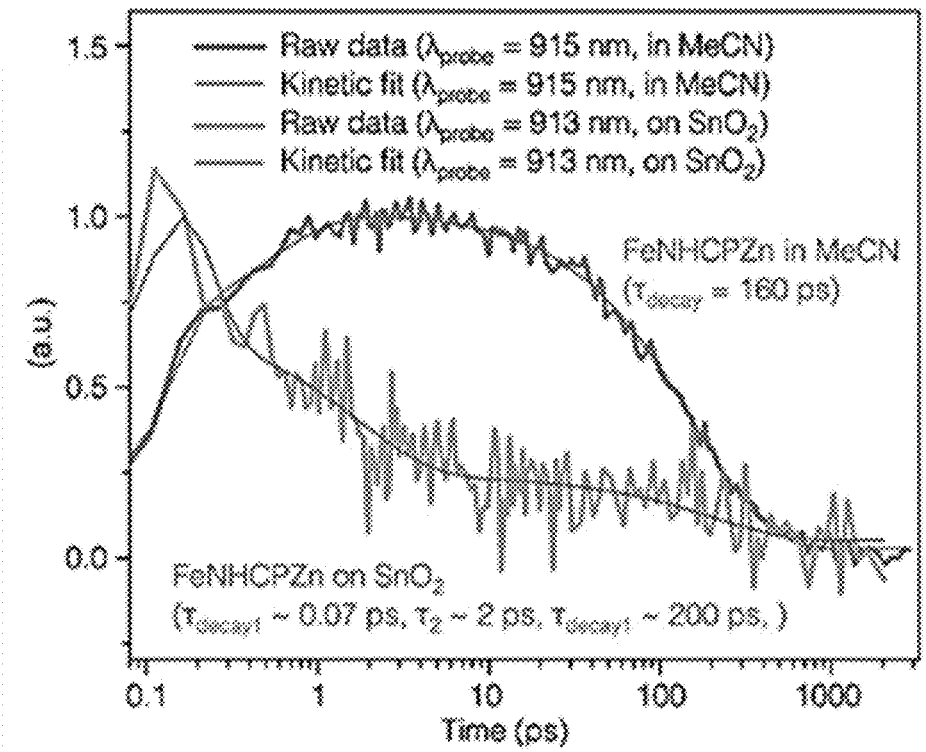
FIG. 17B shows excited state decay dynamics of FeNHCPZn in MCCN solvent and on SnO$_2$.

FIG. 8A shows a schematic diagram of a DSSC architecture that exploits the FeNHCPZn/SnO$_2$/FTO photoelectrode; and FIGS. 8B and 8C show J-V responses obtained for the FeNHCPZn/SnO$_2$/FTO photoelectrode and bare SnO$_2$/FTO photoelectrode, respectively, under dark and AM 1.5 G illumination. Experimental conditions: AM 1.5G light, 0.5 M TBAI, 0.05 M I$_2$, McCN, Pt wire counter electrode, active cell area of ~0.5 cm². The FeNHCPZn $^3$E$^{*/+}$ value (−0.77 V, vs. SCE, FIG. 8A; Eq. S1) indicates exergonic driving forces for electron injection into the CBs of TiO$_2$ (−0.74 V, vs. SCE) and SnO$_2$ (−0.24 V, vs. SCE), two n-type semiconductor electrode materials commonly used in DSSCs (4). As shown in FIGS. 8A-8C, the data highlight the efficacy of FeNHCPZn as a DSSC photosensitizer in a regenerative cell architecture that exploits a FeNHCPZn-sensitized photoelectrode (FeNHCPZn/SnO$_2$/FTO); further details are provided in the Supporting Information. Pump-probe transient absorption spectroscopic experiments that interrogate FeNHCPZn-anchored SnO$_2$ particles corroborate that electron injection into the semiconductor derives from a FeNHCPZn excited state produced via visible light absorption (see FIGS. 17A and 17B). We emphasize that the measured J$_{SC}$ and V$_{OC}$ responses in this regenerative cell represent a rare, if not unique example, of a substantial photosensitization effect achieved in a device architecture using an Fe(II) MLCT chromophore.

Figure 14A:
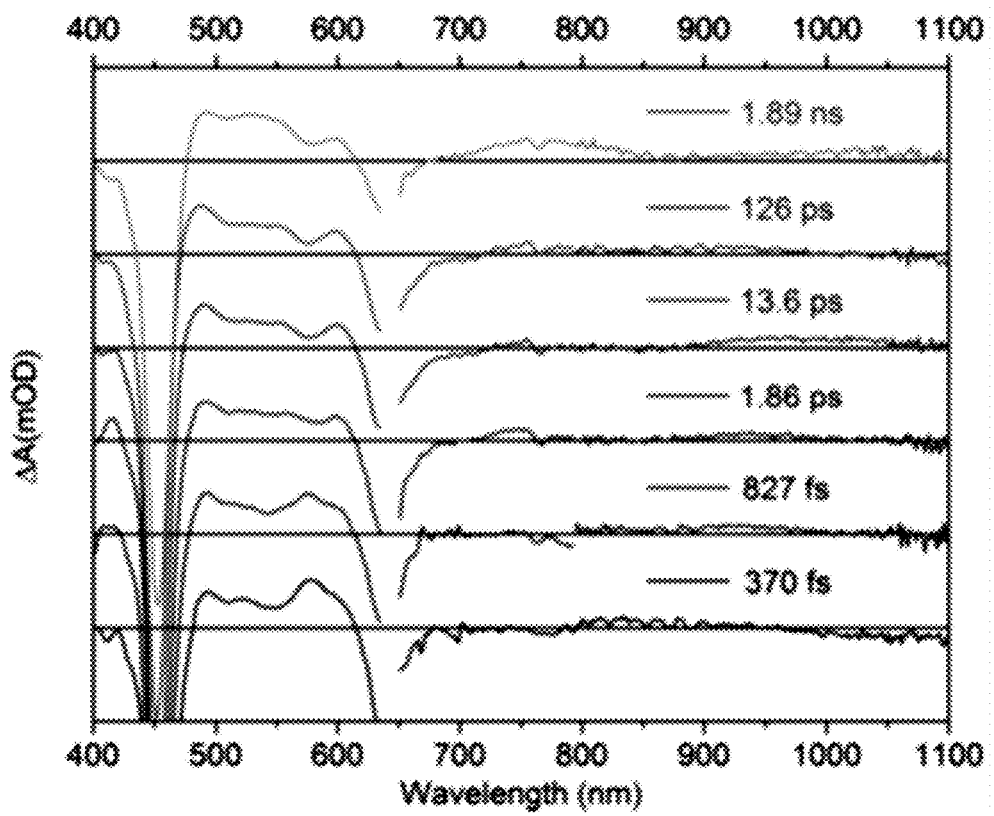
FIGS. 14A and 14B show representative ultrafast pump-probe spectra recorded at several time delays and representative kinetic traces, respectively, at different probe wavelengths for the NHC-ethyne-PZn ligand in MCCN ($\lambda_{ex}$=640 nm; $P_{ex}$=310 μW).
Figure 14B:
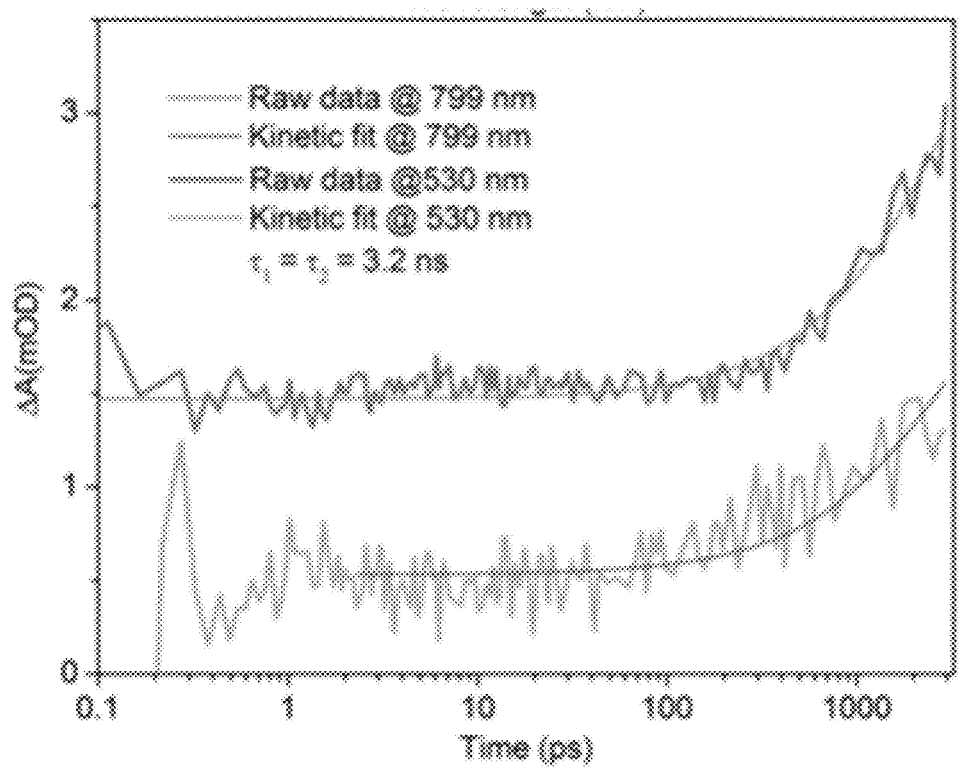

The utility of this new Fe-based chromophore as a DSSC photosensitizer in a regenerative cell architecture that exploits a FeNHCPZn-sensitized photoelectrode (FeNHCPZn/SnO$_2$/FTO) is demonstrated using the prototype cell shown FIG. 8A. In this photoelectrode, the FeNHCPZn molecules are anchored via pyridine-4-carboxylic acid, which simultaneously coordinates the chromophore zinc ion and binds the SnO$_2$ semiconductor surface. FIG. 8B highlights the photocurrent photovoltage (J-V) response of this regenerative cell: the short-circuit current (JSC) and open circuit voltage (VOC) of this system are measured to be 1.25 mA/cm² and 0.18 V respectively, under AM 1.5G light. As can be seen by comparison to FIG. 8C, the photocurrent derived from the SnO$_2$/FTO photoelectrode is negligible, underscoring that electron injection in the FeNHCPZn/SnO$_2$/FTO photoelectrode derives from FeNHCPZn absorption. Pump-probe transient absorption spectroscopic experiments that interrogate identical FeNHCPZn-anchored SnO$_2$ particles corroborate that electron injection into the semiconductor derives from a FeNHCPZn excited state produced via visible light absorption (See FIG. 17A). These measured J$_{SC}$ and VOC responses represent a rare, if not the only example, of a substantial photosensitization effect achieved in a device architecture using an iron (II) MLCT chromophore. While no attempt was made to optimize device performance, it is noted that an identical cell that featured a chromophore/SnO$_2$/FTO photoanode exploited the benchmark N3 dye gave rise to J$_{SC}$=2.1 mA/cm2 and VOC=0.32 V, when examined under identical conditions as shown in FIGS. 14A and 14B, which show representative ultrafast pump-probe spectra recorded at several time delays and representative kinetic traces, respectively, at different probe wavelengths for the NHC-ethyne-PZn ligand in MCCN ($\lambda_{ex}$=640 nm; P$_{ex}$=310 µW).

The long $^3$MLCT state lifetime, substantial $^3$E$^{*/\alpha}$ potential, high oscillator strength UV-vis panchromatic absorptive properties, unprecedented phosphorescence, and the demonstrated photosensitization effect in a DSSC architecture achieved with FeNHCPZn, open up new possibilities for exploiting Fe(II) complexes as photosensitizers for solar energy conversion applications, as photoluminescent materials, and as photo-redox catalysts. The design criteria highlighted in the FeNHCPZn chromophore that leverage (i) decoupling of ligand functions that destabilize MC states from those that lead to stabilized MLCT states, and (ii) engineering of highly polarized MLCT states that minimize spatial overlap of $^3$MLCT-$^{3,5}$MC and $^3$MLCT→S$_0$ wavefunctions, provide a general strategy to realize photosensitizers based on earth-abundant iron. Chromophore designs that further augment the extent of MLCT state polarization in FeNHC-expanded conjugated ligand frameworks (e.g., by modulating PZn motif π* energy levels via electron-withdrawing groups (33), or replacing PZn with other α-polarizable units (51)) offer opportunities to push Fe(II) complex MLCT lifetimes to the sub-µs timescale. We anticipate that this new class of earth-abundant Fe-based photosensitizers with long MLCT excited-state lifetimes and intense visible-light absorption will serve to advance environment-friendly and low-cost solar energy conversion devices.

As can be seen herein, the molecular framework decouples ligand functions that destabilize MC states from those that lead to stabilized MLCT states in the FeNHCPZn supermolecule. Electronic spectral, potentiometric, and ultrafast time-resolved pump-probe transient dynamical data emphasize that electronic excitation of FeNHCPZn gives rise to a low-lying $^3$MLCT excited state having substantial charge-transfer character; state-of-the-art electronic structural computations, using domain-based local pair natural orbital coupled cluster (DLPNO-CCSD(T)) theory, demonstrate the unusual nature of the FeNHCPZn electronically excited triplet (T$_1$) state: in contrast to conventional Fe(II) complexes, it lies substantially lower in energy than its corresponding quintet (Q$_1$) state and features a dipole moment amplified by 30 Debye relative its ground state. The long 160 µs FeNHCPZn $^3$MLCT state lifetime at ambient temperature, coupled with its substantial $^3$E$^{*/+}$ potential, high oscillator strength UV-vis panchromatic absorptive properties, and ability to serve as a photosensitizer in a DSSC architecture, demonstrate new possibilities for exploiting Fe(II) complexes in solar energy conversion applications, as photoluminescent materials, and as photo-redox catalysts. Chromophore designs that further augment the extent of MLCT state polarization and stabilization in FeNHC-expanded conjugated ligand frameworks (e.g., by modulating PZn motif π* energy levels via electron-withdrawing groups, or replacing PZn with other π-polarizable units) offer opportunities to push Fe(II) complex MLCT lifetimes to the sub-µs timescale. It is anticipated that this new class of earth-abundant Fe-based photosensitizers with long MLCT excited-state lifetimes and intense visible-light absorption will serve to advance opportunities for environment-friendly and low-cost solar energy conversion.

Materials and Methods

Synthetic Materials. Tetrahydrofuran (THF) was purchased from Sigma-Aldrich (Inhibitor free, HPLC grade) and distilled over sodium and benzophenone before use. Diisopropylamine was purchased from Sigma-Aldrich (redistilled, 99.95%). All other solvents utilized in syntheses were purchased from Fisher Scientific (HPLC grade). Acetonitrile was dried over calcium hydride and distilled. All other reagents were used as received (Aldrich or Fisher). Chromatographic purification (silica gel 60, 230-400 mesh, EM Science; aluminum oxide, 50-200 µm, 60 Å, Acros Organics; Bio-Beads S-X1, 200-400 mesh, BioRad) of all newly synthesized compounds was accomplished on the bench top.

Synthesis

Figure 9A:
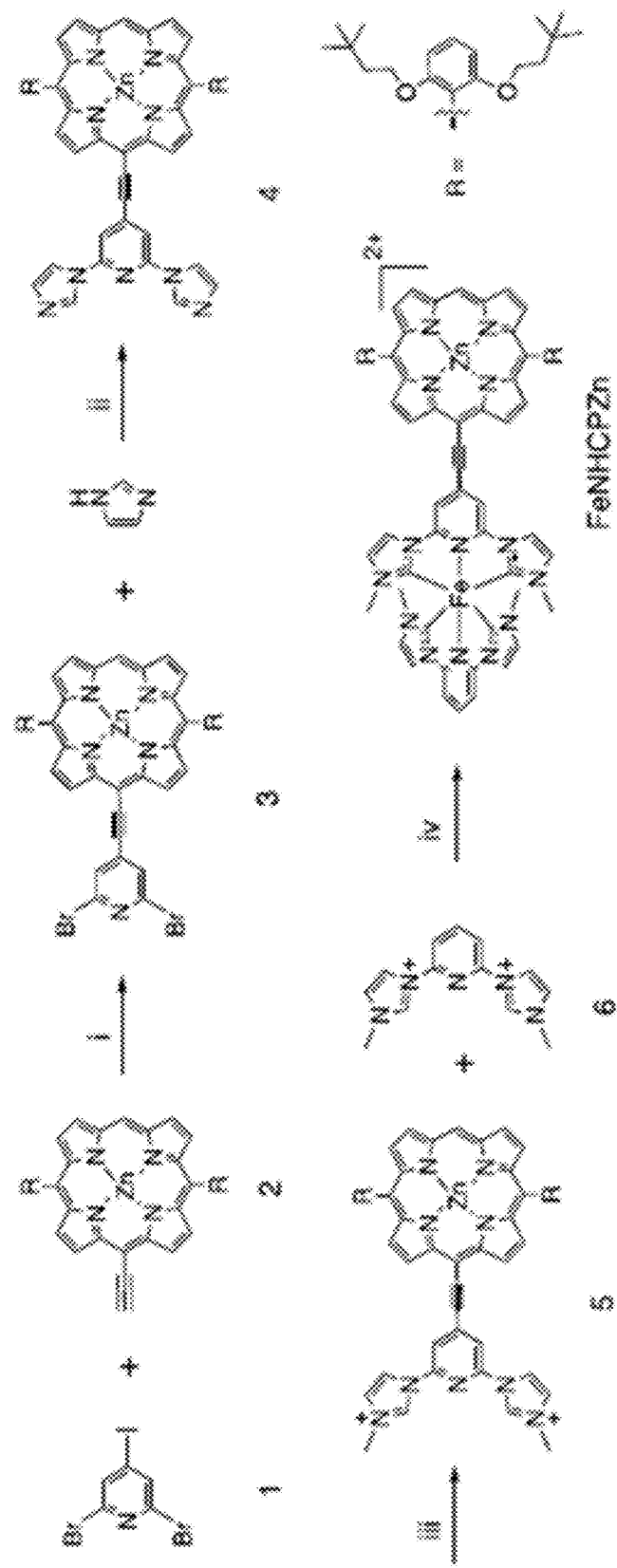
FIG. 9A shows detail of the synthetic route to FeNHCPZn.
Figure 9B:
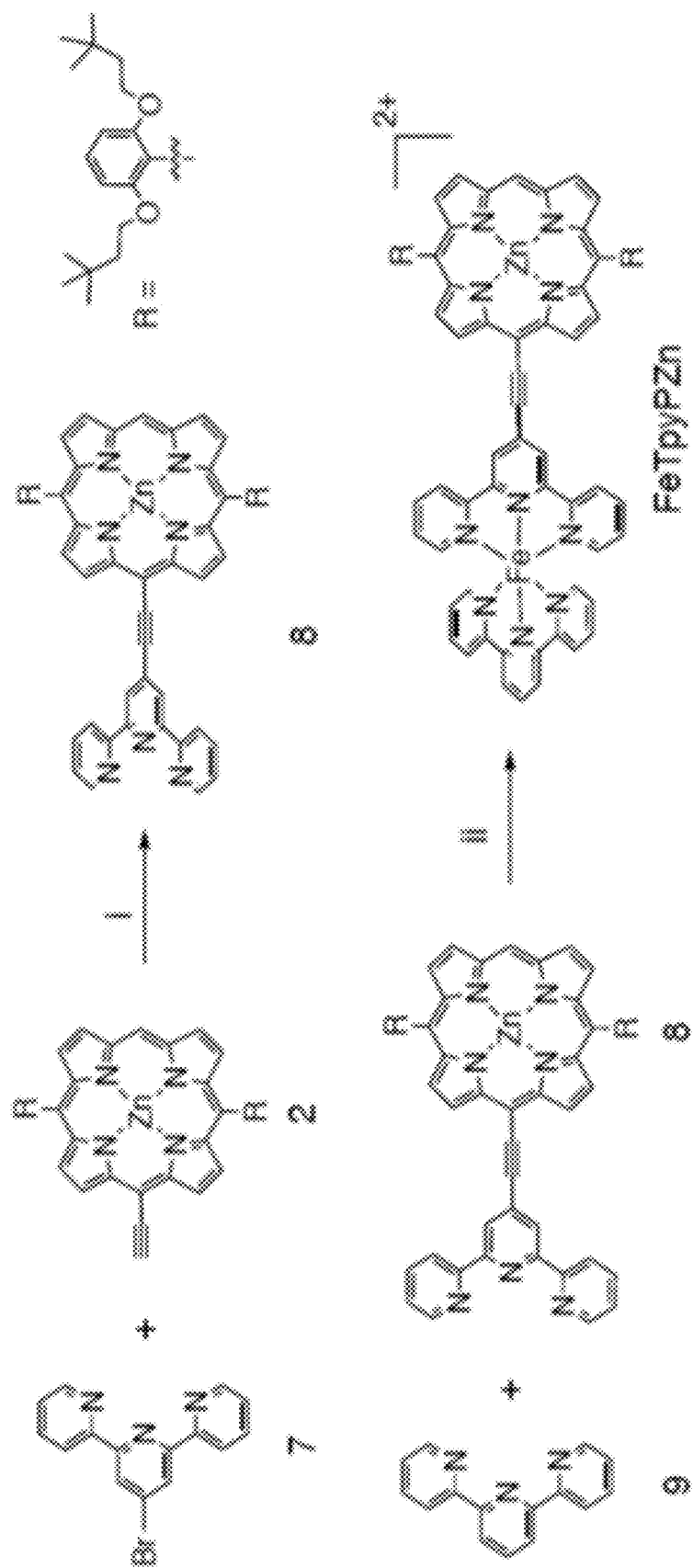
FIG. 9B shows detail of the synthetic route to FeTpyPZn.

FIG. 9A shows detail of the synthetic route to FeNHCPZn; and FIG. 9B shows detail of the synthetic route to FeTpyPZn. FePZn and FeNHCPZn were synthesized with $PF_6^-$ counterions. Syntheses of 1, 2, 6, and 7 were adapted from established synthetic procedures. The following provides details on the synthesis, which for FIG. 9A follow the (i) $Pd_2(dba)_3$, $AsPh_3$, diisopropylamine, THF, 0° C. to RT; (ii) CuI, $Cs_2CO_3$, DMSO, 90° C.; (iii) $Me_3OBF_4$, dry DCM, RT; (iv) t-BuOK, THF, −78° C., anhydrous $FeBr_2$; and for FIG. 9B follow the (i) $Pd(PPh_3)_4$, CuI, diisopropylamine, THF, 60° C.; (ii) $FeCl_2.4H_2O$, MCCN, THF, RT.

[5-(4-Ethynyl-2,6-dibromopyridyl)-10,20-bis(2,6-bis(3,3-dimethyl-1-butyloxy)phenyl)porphinato]zinc(II) (3). A 100 mL Schlenk flask equipped with a stirbar was charged with 1 (138 mg, 0.38 mmol), 2 (180 mg, 0.19 mmol), $Pd_2(dba)_3$ (34.8 mg, 0.038 mmol) and $AsPh_3$ (58.2 mg, 0.19 mmol) under Ar. 40 ml THF and 4 ml diisopropylamine were mixed together and added after being degassed by three freeze-pump-thaw cycles. The mixture was cooled at 0° C. for 1 h and then warmed to RT. When the reaction was complete, the solvent was removed. The compound was then purified by silica gel chromatography (DCM:hexane=3:2) to give a green solid (150 mg, 67%, based on 2). $^1H$ NMR (400 MHz, acetone-$d_6$, ppm): δ 10.16 (s, 1H), 9.71 (s, 2H), 9.29 (d, 2H, J=4 Hz), 8.92 (d, 2H, J=4 Hz), 8.84 (d, 2H, J=4 Hz), 8.26 (s, 2H), 7.79 (t, 2H, J=8 Hz), 7.19 (d, 4H, J=8 Hz), 3.99 (t, 8H, J=4 Hz), 0.88 (t, 8H, J=4 Hz), 0.24 (m, 36H). $C_{63}H_9Br_2NSO_4Zn$: m/z=1183.30, MALDI-TOF: m/z=1184.68 [M+H]$^+$.

[5-(4-Ethynyl-2,6-bis(1H-imidazol-1-yl)pyridyl)-10,20-bis(2,6-bis(3,3-dimethyl-1-butyloxy)phenyl)porphinato]zinc(II) (4). A mixture of 3 (25 mg, 0.021 mmol), imidazole (4.3 mg, 0.063 mmol), CuI (1.6 mg, 0.008 mmol) and $Cs_2CO_3$ (27 mg, 0.084 mmol) were heated in 10 ml dry DMF at 110° C. for two days. After the solvent was removed, the crude product was purified by neutral aluminum oxide chromatography with 5% methanol in DCM as eluent to give a green solid (11 mg, 45%). $^1H$ NMR (400 MHz, THF-$d_8$, ppm): δ 10.01 (s, 1H), 9.69 (d, 2H, J=4 Hz), 9.16 (d, 2H, J=4 Hz), 8.91 (d, 2H, J=4 Hz), 8.80 (d, 2H, J=4 Hz), 8.33 (m, 2H), 8.08 (m, 2H), 7.95 (m, 2H), 7.73 (t, 2H, J=8 Hz), 7.12 (d, 4H, J=8 Hz), 6.88 (m, 2H), 3.96 (t, 8H, J=8 Hz), 0.76 (t, 8H, J=8 Hz), 0.4 (m, 36H). $C_{69}H_7SN_9O_4Zn$: m/z=1157.52, MALDI-TOF: m/z=1159.86 [M+1]$^+$.

[5-(4-Ethynyl-2,6-bis(3-methylimidazolium-1-yl)pyridyl)-10,20-bis(2,6-bis(3,3-dimethyl-1-butyloxy)phenyl)porphinato]zinc(II) bis(hexafluorophosphate) (5). A 100 mL round bottom flask equipped with a stirbar was charged with 4 (60 mg, 0.052 mmol) and $Me_3OBF_4$ (16.9 mg, 0.114 mmol) under Ar; 40 ml dry DCM was then added. The mixture was stirred at RT for 2-3 h. A few drops of water were added to quench the reaction, and the solvent was removed. A small amount of acetonitrile was added to dissolve the mixture. Saturated $KPF_6$ (aqueous solution) was added to precipitate the product. The crude product was filtered and dried. The compound was then purified by silica gel chromatography (MeCN:$H_2O$:saturated $KNO_3$ (aq)=90:9:1). The green band was collected and evaporated to a 5 ml volume, and saturated $KPF_6$ (aqueous solution) was added to precipitate the product, which was then filtered and dried to give a green solid (30 mg, 39%, based on 4). This material was utilized directly in the following synthetic procedure. $C_{63}H_{69}Br_2NSO_4Zn$: m/z=1187.57, MALDI-TOF: m/z=1188.91 [M+H]$^+$.

FeNHCPZn. A 100 mL round bottom flask equipped with a stirbar was charged with 5 (30 mg, 0.02 mmol) and 6 (10.73 mg, 0.02 mmol)under Ar, then 40 ml dry THF was added. The mixture was cooled to −78° C., then t-BuOK (9.99 mg, 0.088 mmol) dissolved in THF was added. After stirring at −78° C. for 20 min, anhydrous $FeBr_2$ (3.9 mg, 0.018 mmol) suspended in THF was added, followed by warming of the reaction to RT. After 1 h, a small amount of water was added and the solution was concentrated. Saturated $KPF_6$ aqueous solution was then added to precipitate the product. The crude product was filtered and dried. The compound was then purified by silica gel chromatography (MeCN:$H_2O$:saturated $KNO_3$ (aq)=95:4:1). The brown band was collected and evaporated to 5 ml, and saturated $KPF_6$ (aqueous solution) was added to precipitate the product, which was then filtered and dried to give a FeNHCPZn as a brown solid (7 mg, 20%). $^1H$ NMR (400 MHz, $CD_3CN$, ppm): δ 10.12 (s, 1H), 9.85 (d, 2H, J=4 Hz), 9.26 (d, 2H, J=4 Hz), 8.95 (d, 2H, J=4 Hz), 8.79 (d, 2H, J=4 Hz), 8.39 (s, 2H), 8.22 (d, 2H, J=2 Hz), 8.21 (t, 1H, J=8 Hz), 8.03 (d, 2H, J=4 Hz), 7.78 (t, 2H, J=8 Hz), 7.77 (d, 2H, J=4 Hz), 7.15 (d, 4H, J=8 Hz), 7.09 (d, 2H, J=2 Hz), 7.03 (d, 2H, J=2 Hz), 3.95 (t, 8H, J=8 Hz), 2.70 (s, 6H), 2.56 (s, 6H), 0.75 (t, 8H, J=8 Hz), 0.13 (m, 36H). $C_{84}H_{92}FeN_{14}O_4Zn$: m/z=1480.61, MALDI-TOF: m/z=1626.99 [M+$PF_6$]*, 1481.47 [M]$^+$.

TpyPZn (8). A 100 mL Schlenk flask equipped with a stirbar was charged with 2 (100 mg, 0.11 mmol), 7 (50 mg, 0.16 mmol), $Pd(PPh_3)_4$ (37 mg, 0.032 mmol) and CuI (6 mg, 0.032 mmol) under Ar. 40 ml THF and 4 ml diisopropylamine were mixed together and added after being degassed with 3 freeze-pump-thaw cycles. When the reaction was complete, cool it down to RT and remove the solvent. The compound was then purified by alumina chromatography (THF:hexane=3:7) to give a green solid (108 mg, 83%, based on 2). $^1H$ NMR (400 MHz, CDCl3, ppm): δ 10.10 (s, 1H), 9.89 (d, 2H, J=4 Hz), 9.26 (d, 2H, J=4 Hz), 9.05 (s, 2H), 9.03 (d, 2H, J=4 Hz), 8.95 (d, 2H, J=4 Hz), 8.84 (d, 2H, J=4 Hz), 8.74 (d, 2H, J=8 Hz), 7.92 (td, 2H, J=8 Hz), 7.74 (t, 2H, J=8 Hz), 7.40 (dd, 2H, J=4 Hz), 7.05 (d, 4H, J=8 Hz), 3.93 (t, 8H, J=8 Hz), 0.88 (t, 8H, J=4 Hz), 0.25 (m, 36H). $C_{73}H_{77}N_7O_4Zn$: m/z=1179.53, MALDI-TOF: m/z=1180.77 [M+H]$^+$.

FeTpyPZn. A 50 mL round bottom flask equipped with a stirbar was charged with FeCl2☐4H2O (3.36 mg, 0.017 mmol) in 10 ml MeCN, 9 (4.4 mg, 0.019 mmol) in 3 ml THF was added dropwise. After 5 mins, TpyPZn (20 mg, 0.017 mmol) in 7 ml THF was added. After 0.5 hr, the solution was concentrated to ~5 ml, and saturated $KPF_6$ aqueous solution was added to precipitate the product. The crude product was filtered and dried. The compound was then purified by silica gel chromatography (MeCN:$H_2O$:saturated $KNO_3$ (aq)=95:4:1). The greenish brown band was collected and evaporated to 10 ml, and saturated $KPF_6$ aqueous solution was added to precipitate the product, which was then filtered and dried to give a FeTpyPZn as brown solid (12 mg, 40%). $^1H$ NMR (400 MHz, CD3CN, ppm): δ 10.17 (s, 1H), 10.05 (d, 2H, J=4 Hz), 9.53 (s, 2H), 9.30 (d, 2H, J=4 Hz), 9.04 (d, 2H, J=4 Hz), 8.96 (d, 2H, J=8 Hz), 8.83 (d, 2H, J=4 Hz), 8.76 (d, 2H, J=8 Hz), 8.72 (t, 1H, J=8 Hz), 8.52 (d, 2H, J=8 Hz), 8.00 (m, 2H), 7.91 (td, 2H, J=8 Hz), 7.82 (d, 2H, J=8 Hz), 7.36 (d, 2H, J=8 Hz), 7.19 (d, 4H, J=8 Hz), 7.14 (m, 6H), 4.00 (t, 8H, J=8 Hz), 0.81 (t, 8H, J=8 Hz), 0.18 (m, 36H). $C_{88}H_{88}FeN_{10}O_4Zn$: m/z=1470.57, MALDI-TOF: m/z=1471.89 [M]+, 1258.84 [M−Tpy+Na]+, 1183.98 [M−Tpy−Fe+1]+.

2. Instrumentation

General Characterization Instruments

A 400 MHz Bruker spectrometer was used to obtain NMR spectra for all synthesized compounds. Chemical shifts for $^1H$ NMR spectra are reported relative to residual protium in deuterated solvents (S (residual)=7.26 ppm in $CDCl_3$, δ

(residual)=1.94 ppm in $CD_3CN$, δ (residual)=2.05 ppm in acetone-$d_6$, δ (residual)=1.72 ppm in THF-$d_8$). All J values are reported in Hertz. Reported MALDI-TOF data were acquired with an Applied Biosystems DE-Pro MALDI-MS at the Department of Chemistry at Duke University. Samples were prepared as micromolar solutions in acetone, using HABA (2-(4-hydroxyphenylazo)benzoic acid) as the matrix. Electronic absorption spectra were acquired on a Shimadzu Pharmaspec UV-1700 spectrometer.

Electrochemistry

Figure 11A:
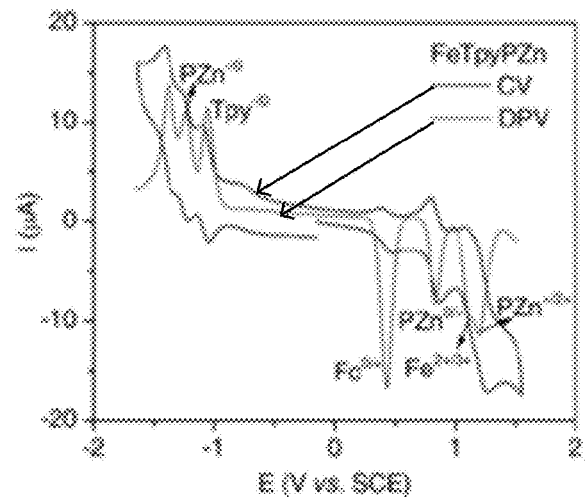
FIGS. 11A-11D illustrate potentiometric data of FeTpyPZn and FeNHCPZn
Figure 11B:
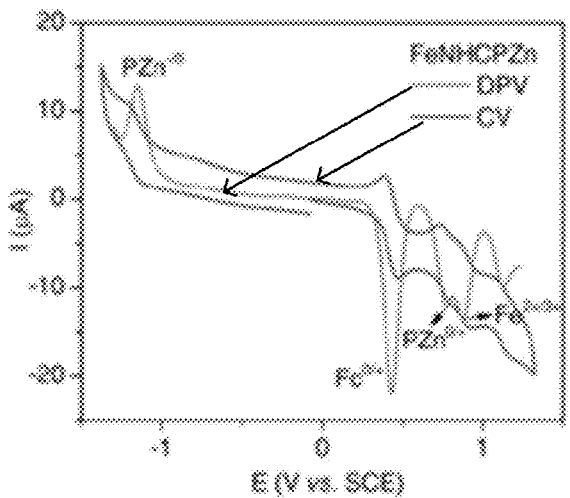
Figure 11C:
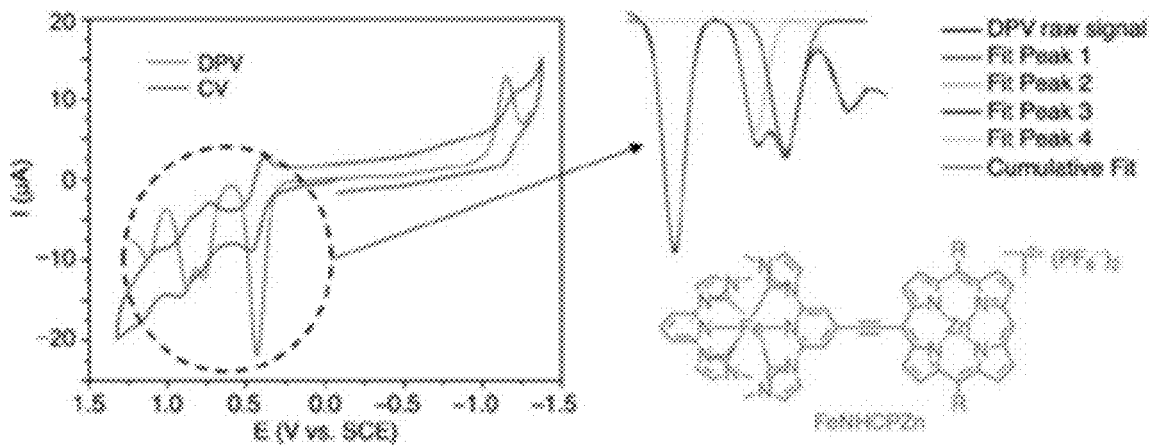
Figure 11D:
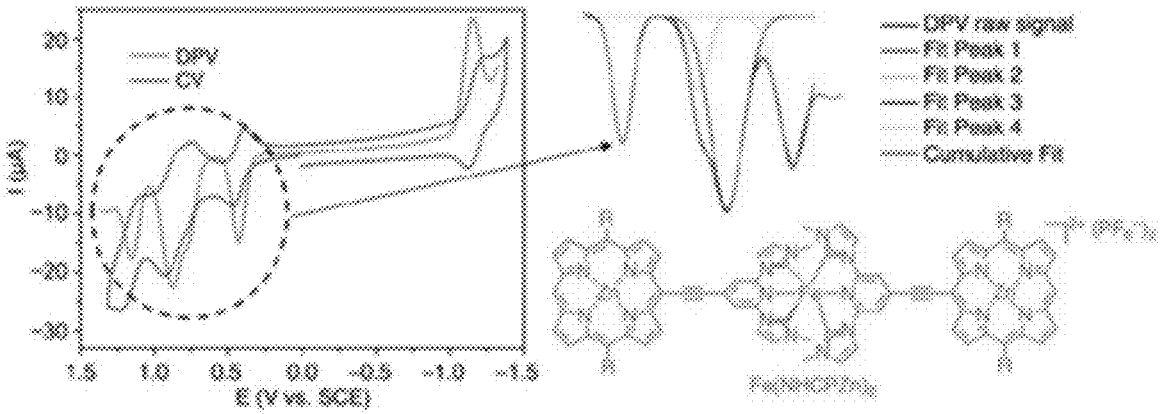

FIGS. 11A-11D illustrate potentiometric data of FeTpyPZn and FeNHCPZn. FIG. 11A shows potentiometric data of FeTpyPZn and FIG. 11B shows potentiometric data of FeNHCPZn (both vs. SCE) in 0.1 M $TBAPF_6$/acetonitrile electrolyte/solvent system. Referring to FIGS. 11A and 11B, the "Red" line represents data from cyclic voltammetry. "Blue" line represents data from differential pulse voltammetry. CV data were only used to show the number of peaks and only DPV data was used for obtaining redox potential values. FIG. 11C shows a fitting of FeNHCPZn DPV signals with gaussian functions; and FIG. 11D shows a fitting of Fe(NHCPZn)2 DPV signals with gaussian functions. Cyclic voltammetry and differential pulse voltammetry (DPV) experiments were performed using a BASi EC Epsilon working station, a Ag/AgCl (3M NaCl) reference electrode, a Pt wire counter electrode, and a glassy carbon working electrode. The ferrocene/ferrocenium redox couple (0.43 V vs. SCE) was used as an internal standard.

As illustrated in FIGS. 11B and 11D, FeNHCPZn has close-lying $E^{0/+}$=0.76 V and $E^{+/2+}$=0.88 V potentials (both vs. SCE). Here $E^{0/+}$=0.76 V is assigned to be derived from the $Fe^{2+/3+}$ redox pair and $E^{+/2+}$=0.88 V is assigned to be derived from the $PZn^{0/+}$ redox pair, based on:
1) The $PZn^{0/+}$ redox pair derived potentials in similarly structured RuPZn and FePZn are 0.87 V and 0.83 V, respectively.
2) Both the redox potentials of FeNHCPZn and Fe(NHCPZn)$_2$, the homoleptic version of FeNHCPZn, have been measured by DPV and fitted by gaussian functions (FIGS. 11C and 11D). The ratio of the fitted peak area of $E^{0/+}$=0.76 V and $E^{+/2+}$=0.88 V signals is ~1 for FeNHCPZn; in comparison, as the ratio of (PZn moiety)/(Fe metal core) increases to 2 in Fe(NHCPZn)$_2$, the ratio of the fitted peak area of $E^{0/+}$+=0.75 V and $E^{+/2+}$=0.88 V signals becomes clearly <1.

Ultrafast (Fs-Ns) Pump-Probe Transient Absorption Spectroscopy

Ultrafast transient absorption spectra were obtained using standard pump-probe methods. Optical pulses (≥120 fs) centered at 775 nm, were generated using a Ti:Sapphire laser (Clark-MXR, CPA-2001, Dexter, MI, USA), which consisted of a regenerative amplifier seeded by a mode-locked fiber oscillator. The output of the regenerative amplifier was split to feed an optical parametric amplifier (Light Conversion Ltd., TOPAS-C, Vilnius, Lithuania), which generates excitation pulses tunable in wavelength from the UV through the NIR region. The pump beam was chopped at half the laser repetition rate (~500 Hz). A fraction (<5%) of the output from the regenerative amplifier was passed through an optical delay line, and focused onto a 3 mm c-cut sapphire plate to generate a white light continuum, which was used as the probe beam. The polarization and attenuation of the pump and probe beams were controlled by half-wave plate and Rochon prism polarizer pairs. The polarization was set to the magic angle (54.7°) for these experiments. The pump beam was focused into the sample cell with an f=20 cm lens, while the probe beam was focused with a parabolic mirror. The excitation pump power was measured using a power meter (Coherent, LabMax Top with PS19 head). After passing through the sample, the probe light was adjusted using a neutral density filter to avoid saturating the detector, and focused onto the entrance slit of a computer-controlled image spectrometer (Acton Research Corporation, SpectraPro-150, Trenton, NJ, USA). A CCD array detector (1024×128 elements, Roper Scientific, Trenton, NJ, USA), interfaced to the spectrometer, recorded the spectrum of the probe light from the UV (~370 nm) to the NIR (~1100 nm), providing spectral resolution better than 0.5 nm. Pairs of consecutive spectra were measured with ($I_{on}(\lambda)$) and ($I_{off}(\lambda)$) to determine the difference spectrum, $\Delta A = \log(I_{off}(\lambda))/(I_{on}(\lambda))$. All these experiments utilized a custom-built 2 mm-path-length fused-silica sample cell; all transient optical studies were carried out at 21±1° C. in freshly distilled acetonitrile solvent. All transient spectra reported represent averages obtained over 3-5 scans, with each scan consisting of ~300 time delays spaced on a log scale, with each time delay an average of 3000 frames. In these experiments, the optical delay line utilizes a computer-controlled delay stage. Delay times up to 4 ns were achieved using a Compumotor-6000 (Parker). Following all pump-probe transient absorption experiments, electronic absorption spectra verified that the samples were robust.

Time-Resolved Emission Spectroscopy

Time-resolved emission data were recorded using a Hamamatsu C4780 picosecond fluorescence lifetime measurement system, which utilizes a Hamamatsu Streakscope C4334 photon counting detector, a Hamamatsu C4792-01 synchronous delay generator, and a Stanford Research Systems DG535 electronic delay generator. FeNHCPZn was excited by a Hamamatsu PLP-10 laser diode (405 nm), and the polarization of emission was set to the magic angle (54.7°) for these experiments. Hamamatsu HPD-TA software was used to acquire emission data in the single-photon counting mode, and its fitting module was used to fit the emission lifetime by deconvolution with the experimentally determined instrument response function (irf). The irf was measured using a scattering sample (cream or silica dispersed in water). Sample concentrations were adjusted to give an optical density of ~0.1 at the excitation wavelength.

DSSC Device Configuration
Photocurrent-Photovoltage Measurements $SnO_2$ nanoparticle-coated FTO glass substrates were prepared using established methods. N3 dye-loaded $SnO_2$/FTO photoelectrodes were prepared by immersing the $SnO_2$/FTO slide in an ethanol solution containing 0.5 mM $N_3$ [bis(isothiocyanato)bis(2,2'-bipyridyl-4,4'-dicarboxylato)ruthenium(II)] for 24 h. The FeNHCPZn-sensitized photoelectrode (FeNHCPZn/$SnO_2$/FTO) was prepared by immersing an $SnO_2$/FTO slide in ethanol solution containing 1 mM pyridine-4-carboxylic acid for 24 h, following which it was exposed to an ethanol solution containing 0.5 mM FeNHCPZn (24 h). After drying the FeNHCPZn/$SnO_2$/FTO under a $N_2$ stream, a simplified regenerative cell was assembled with this photoelectrode using a Pt wire as the cathode and an acetonitrile electrolyte solution containing 0.5 M tetra-n-butylammonium iodide and 0.05 M $I_2$. Photocurrent-photovoltage (J-V) responses were measured using a Newport Oriel 92192 solar-simulated light source (AM 1.5G filtered, 100 mW cm$^{-2}$) with a Keithley 2400 source meter. The active cell areas in these devices were typically 0.5 cm$^2$.

3. Electronic Absorption and Pump-Probe Spectra of NHC-Ethyne-PZn

Figure 13:
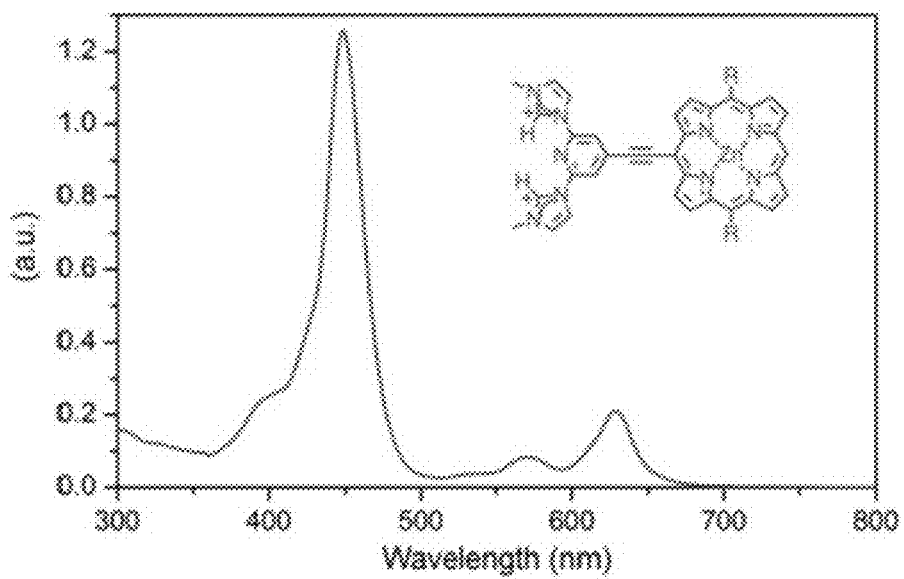
FIG. 13 shows the electronic absorption spectrum of NHC-ethyne-PZn.
Figure 15:
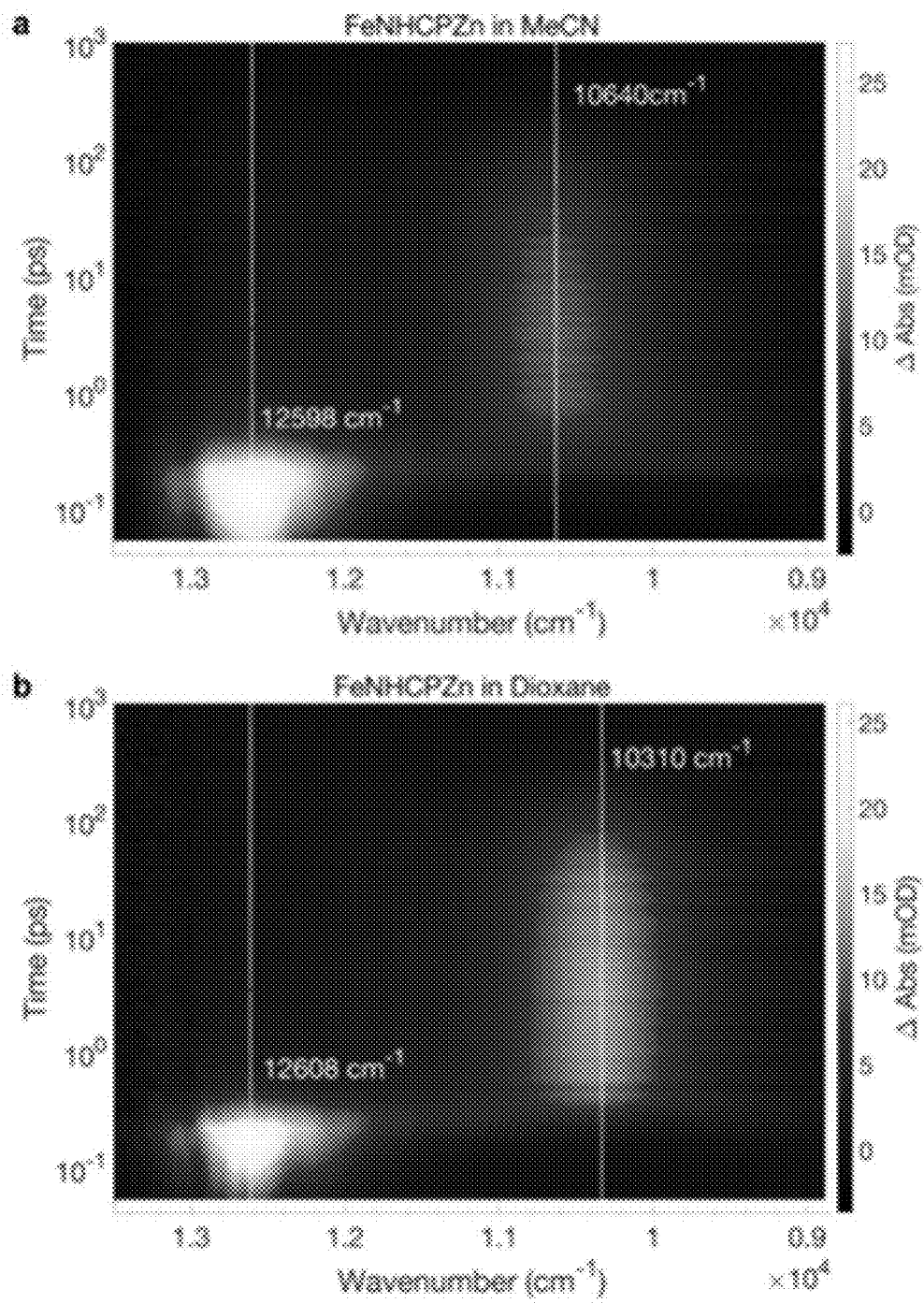
FIG. 15 shows a 2D-plot of FeNHCPZn pump-probe spectra recorded in (a) MCCN and (b) dioxane solvents.
Figure 16:
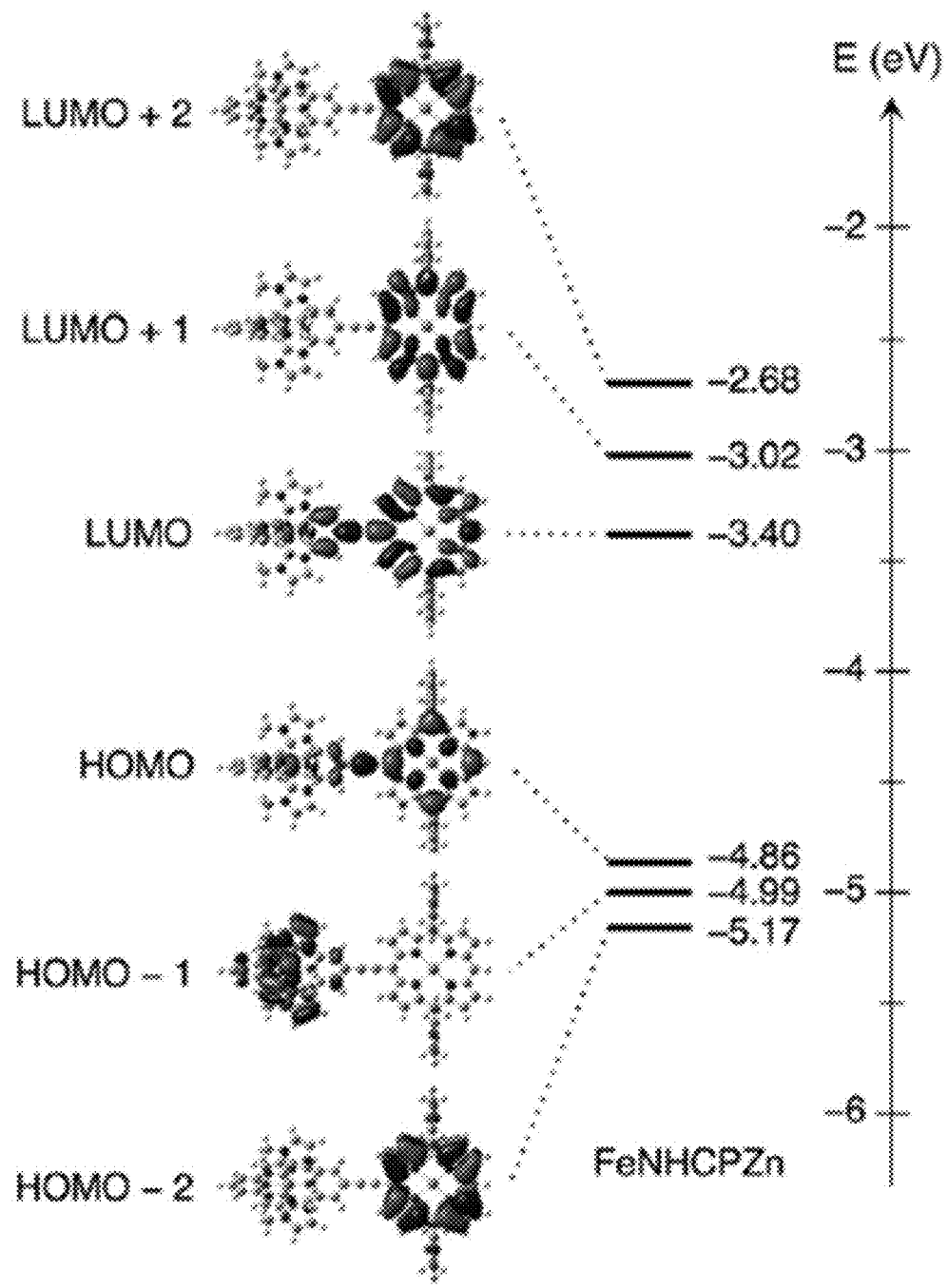
FIG. 16 shows calculated FeNHCPZn frontier orbitals using the BP86 functional and the 6-31G(d)/LanL2DZ basis sets.

FIG. 13 shows the electronic absorption spectrum of NHC-ethyne-PZn. FIGS. 14A and 14B show representative ultrafast pump-probe spectra recorded at several time delays and representative kinetic traces, respectively, at different probe wavelengths for the NHC-ethyne-PZn ligand in MCCN ($\lambda_{ex}$=640 nm; $P_{ex}$=310 µW). FIG. 15 shows a 2D-plot of FeNHCPZn pump-probe spectra recorded in (a) MCCN and (b) dioxane solvents. (The $T_1$-$T_n$ transition band maximum in dioxane solvent redshifts −330 cm$^{-1}$ relative to that observed in MCCN while the S1→Sn transition band maximum redshifts only −10 cm$^{-1}$.) Without the presence of Fe(II) metal core, the MLCT derived band of FeNHCPZn that is centered ~516 nm is absent in the spectrum of NHC-ethyne-PZn. Moreover, the NHC-ethyne-PZn B-derived band (FWHM=1437 cm$^{-1}$, that of TIPS-E-PZn is 662 cm$^{-1}$) is much narrower than the B-derived band of FeNHCPZn(FWHM=2279 cm$^{-1}$), due to the smaller extent of CT character without mixing with Fe complex derived MLCT state.

Unlike the pump-probe transient absorption spectra of FeNHCPZn, the spectra of NHC-ethyne-PZn (see FIG. 14A) do not present prominent NIR signals in 700~1100 nm spectral range. Only at a longer delay time on ns scale, the rise of a very weak NIR band centered ~770 nm is detected along with the signal rise at ~530 nm with τ=3.2 ns. This excited absorption feature resembles that of porphyrin monomers and the 3.2 ns time constant is typical of porphyrin monomers ISC time constant.

The comparison of FeNHCPZn and NHC-ethyne-PZn excited state absorption features indicates that while NHC-ethyne-PZn excited states mainly exhibit porphyrin-derived π-π* character, the excited states of FeNHCPZn evince new features as a result of extensive excited state mixing between building-block chromophoric moieties.

4. Excited-State Redox Potentials

The redox potentials of FeNHCPZn and Fe(NHC)$_2$ electronically excited states are calculated from respective $E_{0,0}$ energies and ground state redox potentials.

The $T_1$ state $E_{0,0}$ energy of FeNHCPZn is estimated from the $^3$CT emission energy corresponding to 10% intensity of that of the highest energy emission maximum (the "10% rule"), assuming a Gaussian emission shape. Thus, the $T_1$ state $E_{0,0}$ energy of FeNHCPZn is estimated as 1.53 eV.

$$^3E(\text{FeNHCPZn})^{*/+}=E(\text{FeNHCPZn})^{0/+}-^3E_{0,0}=0.76-1.53=-0.77V \quad \text{(Eq. S1)}$$

5. A Proof of Principle DSSC Architecture that Exploits FeNHCPZn

Figure 18:
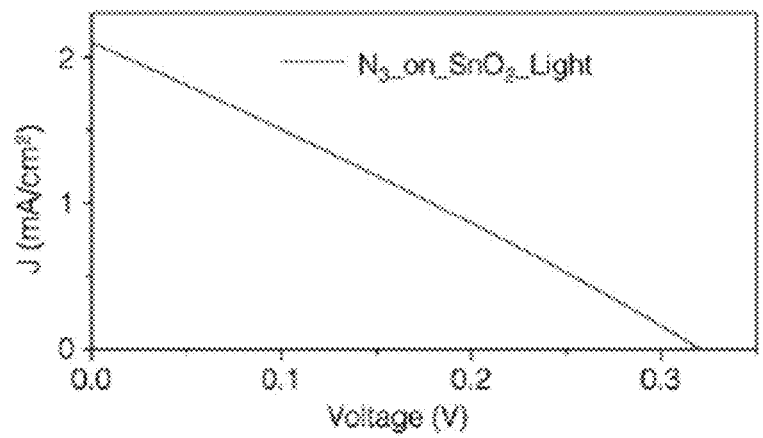
FIG. 18 shows J-V response for a DSSC in an identical cell configuration as FIG. 8A that featured a chromophore/SnO$_2$/FTO photoanode based on the benchmark N3 dye.

FIGS. 8A-8C highlight the utility of FeNHCPZn as a DSSC photosensitizer in a regenerative cell architecture that exploits a FeNHCPZn-sensitized photoelectrode (FeNHCPZn/SnO$_2$/FTO). In this photoelectrode, the FeNHCPZn molecules are anchored via pyridine-4-carboxylic acid, which simultaneously coordinates the zinc ion of the supermolecule and binds the SnO$_2$ semiconductor surface (see FIG. 8A). As previously described, FIG. 8B shows the photocurrent-photovoltage (J-V) response of this regenerative cell: the short-circuit current (JSC) and open-circuit voltage (VOC) of this system were determined to be 1.25 mA/cm$^2$ and 0.18 V respectively, under AM 1.5 G light (performance without optimization). Note that the photocurrent derived from the SnO$_2$/FTO photoelectrode is negligible (see FIG. 18, which shows J-V response for a DSSC in an identical cell configuration as FIG. 8A that featured a chromophore/SnO$_2$/FTO photoanode based on the benchmark N3 dye. Experimental conditions: AM 1.5G light, 0.5 M TBAI, 0.05 M I2, MeCN, Pt wire counter electrode, active cell area of ~0.5 cm$^2$), underscoring that electron injection in the FeNHCPZn/SnO$_2$/FTO photoelectrode derives from FeNHCPZn absorption. While no attempt was made to optimize device performance, we note that an identical cell that featured a chromophore/SnO$_2$/FTO photoanode and exploited the benchmark N3 dye gave rise to $J_{SC}$=2.1 mA/cm$^2$ and $V_{OC}$=0.32 V, when examined under identical conditions.

6. Computational Details

All structures were optimized using selected DFT functionals (M06L, B3LYP, and TPSSh) with the polarizable continuum model (acetonitrile) as implemented in Gaussian 16 A03. The def2-SVP basis set was employed for C, N, O and H atoms, and the Lanl2DZ ECP basis was used for the Zn atom. For the Fe atom, a small core relativistic pseudopotential ECP10MDF was employed along with a valence (8s7p6d2f1g)/[6s5p3d2f1g]basis set. Empirical dispersion corrections were used in all the DFT calculations: D3BJ for B3LYP, and TPSSh and D3 for M06L. The stability of the DFT wave function was checked for all the optimized structures. DFT results were further verified by the domain-based local pair natural orbital coupled cluster (DLPNO-CCSD(T)) theory as implemented in the ORCA 4.2.1 quantum chemistry package. DLPNO-CCSD(T) is designed to reproduce approximately 99.9% of the canonical correlation energy and aims to deliver results of "gold-standard" quality. The DLPNO-CCSD(T) computations were performed using the def2-SVP basis set for all atoms with the NormalPNO threshold and the CPCM model that simulates the solvent effects. The DFT computed relative energies of the quintet and triplet states are consistent with the CCSD(T) predictions and agree closely with experiments.

Figure 19:
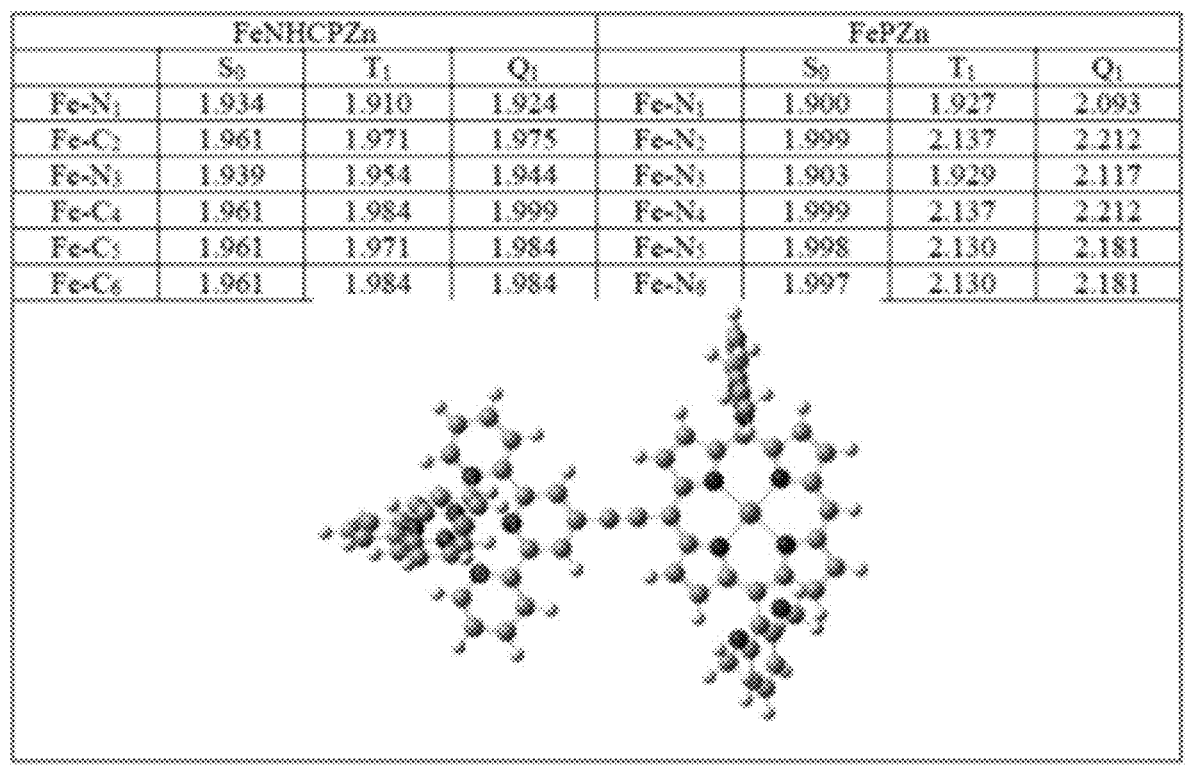
FIG. 19 shows distances (Å) between the iron and ligand atoms at the B3LYP-optimized minima on the computed S0, T1, and Q1 potential energy surfaces. The ligand atom ordering is the same for FeNHCPZn and FePZn.

As shown by B3LYP computed SOMOs of FeNHCPZn (see e.g., FIGS. 7A and 7B, the FeNHCPZn Q$_1$ state has a mixed character of charge transfer and local excitation. Thus, the low energy $^5$MC electronically excited state common to traditional Fe coordination complexes such as Fe(tpy)$_2$ appears as a higher lying quintet state in FeNHCZn. This FeNHCZn Q$_1$ state manifests both $^5$MC and CT transition character that involves the conjugated extended ligand, due to the extensive degree of configuration interaction that describes the electronically excited states of this supermolecule. FIG. 19 shows distances (Å) between the iron and ligand atoms at the B3LYP-optimized minima on the computed S0, T1, and Q1 potential energy surfaces. The ligand atom ordering is the same for FeNHCPZn and FePZn.

Redox Catalysts

FIGS. 20A-20D summarize benchmark calculations for candidate FeNHC-acceptor systems. FIG. 20A shows relative potential energies, in eV (top), and dipole moments, in D (bottom), of the lowest energy singlet, triplet, and quintet states of FeNHC-NDI and FeNHC-PMI; the X-axis aligns with the ethyne bridge in each structure; FIG. 20B shows molecular structures of the NDI (top) and PMI (bottom) acceptor moieties; and FIGS. 20C and 20D show singly occupied molecular orbitals (SOMOs) for the T$_1$ state of FeNHC-NDI and FeNHC-PMI, respectively. FIG. 20A summarizes density functional theory (DFT) calculations for two proposed FeNHC-acceptor structures, shown in FIG. 20B, featuring NDI- and PMI-based rylene derivatives. The energetic minima for the ground-state singlet, and electronically excited triplet ($T_1$)- and quintet ($Q_1$)-states for each structure were calculated, along with the dipole moment magnitudes of the ground and lowest energy triplet and quintet states, using multiple DFT functionals (MN15, M06L, and TPSSh), which underscore the consistency of these results. Note that in both FeNHC-NDI and FeNHC-PMI, the calculated lowest $T_1$ state energy is lower than its $Q_1$ state energy. Additionally, the lowest-energy $T_1$ and $Q_1$ states of each compound manifest dipole moments ~40 D greater in magnitude than those of their corresponding ground states. These results suggest that these designs will realize the formation of long-lived light-triggered $^3$MLCT states, related to that evinced for FeNHC—PZn; FIGS. 20C and 20D further highlight this point, showing the SOMOs that describe the respective $T_1$ states for FeNHC-NDI and FeNHC-PMI. Note that for both compounds, one SOMO shows electron density localized primarily at the Fe metal center, while the other depicts electron density delocalized over the extended NHC-E-rylene-acceptor ligand framework. These SOMOs illustrate the distinct MLCT character of these $T_1$ state, and emphasize the diminished roles played by MC states in defining their excited-state relaxation dynamics.

FIG. 21A illustrates a photoredox catalyst synthetic scheme incorporating a photoredox catalyst as described with respect to FIG. 4B. Referring to FIG. 21A, a trifluoromethyl radical is generated through a single-electron reduction before addition to a styrene derivative. Oxidation of the substrate by the iron complex followed by nucleophilic addition to this intermediate affords a three-component product. This catalytic scheme is amenable to structural and electronic diversity of the components, allowing a large number of products to be achieved. Through careful catalyst engineering, however, it is also possible to enable substrate specificity. This targeting would be desirable in industrial processes where complex mixtures of byproducts are produced. Waste materials could be converted to useful products without the need for multiple pre-purification steps.

FIG. 21B shows triplet-triplet energy transfer from iron-based triplet sensitizer to acceptor molecules. Here, upon excitation, an Fe complex $^3$MLCT state is generated, which can engage in triplet-triplet energy transfer (TTET) with an acceptor (A) molecule. Here, A, can serve as a second diffusible photoredox catalyst suitable for driving substrate-to-product conversions that leverage biphasic reaction media. Likewise this strategy shown in FIG. 21B can be employed to dimerize conjugated organic substrates with visible light, similar to reactions that have been accomplished using a Ru(II) photocatalyst, and in [2+2]cycloadditions of styrenes using Ir(III) and visible light.

Articles "a" and "an" are used herein to refer to one or to more than one (i.e., at least one) of the grammatical object of the article. By way of example, "an element" means at least one element and can include more than one element.

Unless otherwise defined, all technical terms used herein have the same meaning as commonly understood by one of ordinary skill in the art to which this disclosure belongs.

No admission is made that any reference, including any non-patent or patent document cited in this specification, constitutes prior art. In particular, it will be understood that, unless otherwise stated, reference to any document herein does not constitute an admission that any of these documents forms part of the common general knowledge in the art in the United States or in any other country. Any discussion of the references states what their authors assert, and the applicant reserves the right to challenge the accuracy and pertinence of any of the documents cited herein. All references cited herein are fully incorporated by reference, unless explicitly indicated otherwise. The present disclosure shall control in the event there are any disparities between any definitions and/or description found in the cited references.

One skilled in the art will readily appreciate that the present disclosure is well adapted to carry out the objects and obtain the ends and advantages mentioned, as well as those inherent therein. The present disclosure described herein are presently representative of preferred embodiments, are exemplary, and are not intended as limitations on the scope of the present disclosure. It is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A photosensitizer compound comprising:
    an iron complex with at least one N-heterocyclic carbene (NHC) ligand;
    a linking unit; and
    a polarizable unit formed of a pi conjugated structure having a one-electron reduction potential more positive than the at least one NHC ligand.

2. The photosensitizer compound of claim 1, wherein the polarizable unit comprises a metal porphyrin.

3. The photosensitizer compound of claim 2, wherein the metal porphyrin is zinc porphyrin (PZn).

4. The photosensitizer compound of claim 2, wherein the metal porphyrin is magnesium porphyrin (PMg).

5. The photosensitizer compound of claim 1, wherein the photosensitizer compound is in a form of FeNHCPZn.

6. The photosensitizer compound of claim 1, wherein the polarizable unit comprises: porphyrin, porphycene, rubyrin, rosarin, hexaphyrin, sapphyrin, chlorophyl, chlorin, phthalocyanine, porphyrazine, bacteriochlorophyl, pheophytin, or texaphyrin.

7. The photosensitizer compound of claim 1, wherein the polarizable unit comprises rylene.

8. The photosensitizer compound of claim 7, wherein the rylene is selected from the group consisting of naphthalene-1,8:4,5-tetracarboxylic diimides (NDIs), perylene-3,4,9,10-tetracarboxylic diimides (PDIs), terrylenetetracarboxylic diimides (TDI), quaterrylenetetracarboxylic diimides (QDI), pentarylene-tetracarboxylic diimides (5DI), and hexarylene tetracarboxylic diimides (HDI).

9. The photosensitizer compound of claim 1, wherein the polarizable unit comprises quinones, flavins, acenes, heteroaromatic fused ring compounds, fullerenes, or graphene fragments.

10. The photosensitizer compound of claim 1, wherein the linking unit is ethynyl, vinyl, thiophenyl, diethynylaryl, divinylaryl, diethynyl(unsaturated heterocycloalkenyl), divinyl(unsaturated heterocycloalkenyl), diethynyl(unsaturated heterocycloalkynyl), or divinyl(unsaturated heterocycloalkynyl).

11. A dye-sensitized solar cell, comprising:
    a rear substrate comprising conducting glass;
    a rear contact at the rear substrate for coupling the cell to a load;
    a counter electrode on the rear substrate;
    a front substrate comprising conducting glass;
    a front contact at the front substrate for coupling the cell to the load;

a semiconductor oxide electrode on the front substrate and facing the rear substrate; and a photosensitizer compound on the semiconductor oxide electrode, wherein the photosensitizer compound comprises:

an iron complex with at least one N-heterocyclic carbene (NHC) ligand;

a linking unit; and a polarizable unit formed of a pi conjugated structure having a one-electron reduction potential more positive than the at least one NHC ligand.

12. The dye-sensitized solar cell of claim 11, wherein the polarizable unit comprises a metal porphyrin.

13. The dye-sensitized solar cell of claim 12, wherein the metal porphyrin is zinc porphyrin (PZn).

14. The dye-sensitized solar cell of claim 12, wherein the metal porphyrin is magnesium porphyrin (PMg).

15. The dye-sensitized solar cell of claim 11, wherein the photosensitizer compound is in a form of FeNHCPZn.

16. The dye-sensitized solar cell of claim 11, wherein the polarizable unit comprises: porphyrin, porphycene, rubyrin, rosarin, hexaphyrin, sapphyrin, chlorophyl, chlorin, phthalocyanine, porphyrazine, bacteriochlorophyl, pheophytin, or texaphyrin.

17. The dye-sensitized solar cell of claim 11, wherein the polarizable unit comprises quinones, flavins, acenes, heteroaromatic fused ring compounds, fullerenes, or graphene fragments.

18. The dye-sensitized solar cell of claim 11, wherein the linking unit is ethynyl, vinyl, thiophenyl, diethynylaryl, divinylaryl, diethynyl(unsaturated heterocycloalkenyl), divinyl(unsaturated heterocycloalkenyl), diethynyl(unsaturated heterocycloalkynyl), or divynyl(unsaturated heterocycloalkynyl).

* * * * *